(12) United States Patent
Gupta et al.

(10) Patent No.: US 6,653,962 B2
(45) Date of Patent: Nov. 25, 2003

(54) SUPERCONDUCTING DUAL FUNCTION DIGITIZER

(76) Inventors: Deepnarayan Gupta, 171 Weed Ave., Hawthorne, NY (US) 10532; Saad Sarwana, 21 Greenridge Ave., Apt. A2, White Plains, NY (US) 10605; Alex Kirichenko, 29 N. Evarbs Ave., Elmsford, NY (US) 10523; Oleg Mukhanov, 23 Dring La., Putnam Valley, NY (US) 10579

(*) Notice: Subject to any disclaimer, the term of this patent is extended or adjusted under 35 U.S.C. 154(b) by 0 days.

(21) Appl. No.: 09/999,864

(22) Filed: Oct. 19, 2001

(65) Prior Publication Data

US 2003/0076251 A1 Apr. 24, 2003

(51) Int. Cl.[7] ................................................ H03M 1/12
(52) U.S. Cl. ........................ 341/155; 341/133; 341/164; 341/166
(58) Field of Search ................................ 341/133, 155, 341/166, 164

(56) References Cited

U.S. PATENT DOCUMENTS

| | | | | |
|---|---|---|---|---|
| 4,646,060 A | * | 2/1987 | Phillips et al. | 341/171 |
| 4,672,359 A | * | 6/1987 | Silver | 341/131 |
| 4,879,488 A | * | 11/1989 | Silver | 341/171 |
| 5,272,479 A | * | 12/1993 | Silver | 341/133 |
| 5,886,660 A | * | 3/1999 | Loewenstein | 341/166 |
| 5,942,997 A | * | 8/1999 | Silver et al. | 341/133 |
| 6,177,901 B1 | * | 1/2001 | Pan et al. | 341/166 |

* cited by examiner

*Primary Examiner*—Michael Tokar
*Assistant Examiner*—Linh Van Nguyen

(57) ABSTRACT

A dual function superconducting digitizer circuit which can selectively function either as an analog-to-digital converter (ADC) or as a time-to-digital converter (TDC). Superconducting ADCs and TDCs can provide performance far superior to that obtained using conventional electronics by taking advantage of the intrinsic properties—high switching speed, quantum accuracy, dispersion-less transmission lines, radiation hardness, and extremely low power dissipation—of superconductivity. Since both ADC and TDC functions are desired in most measurement systems, a dual-function digitizer is not only more attractive from a system integration perspective but is also more marketable.

37 Claims, 17 Drawing Sheets

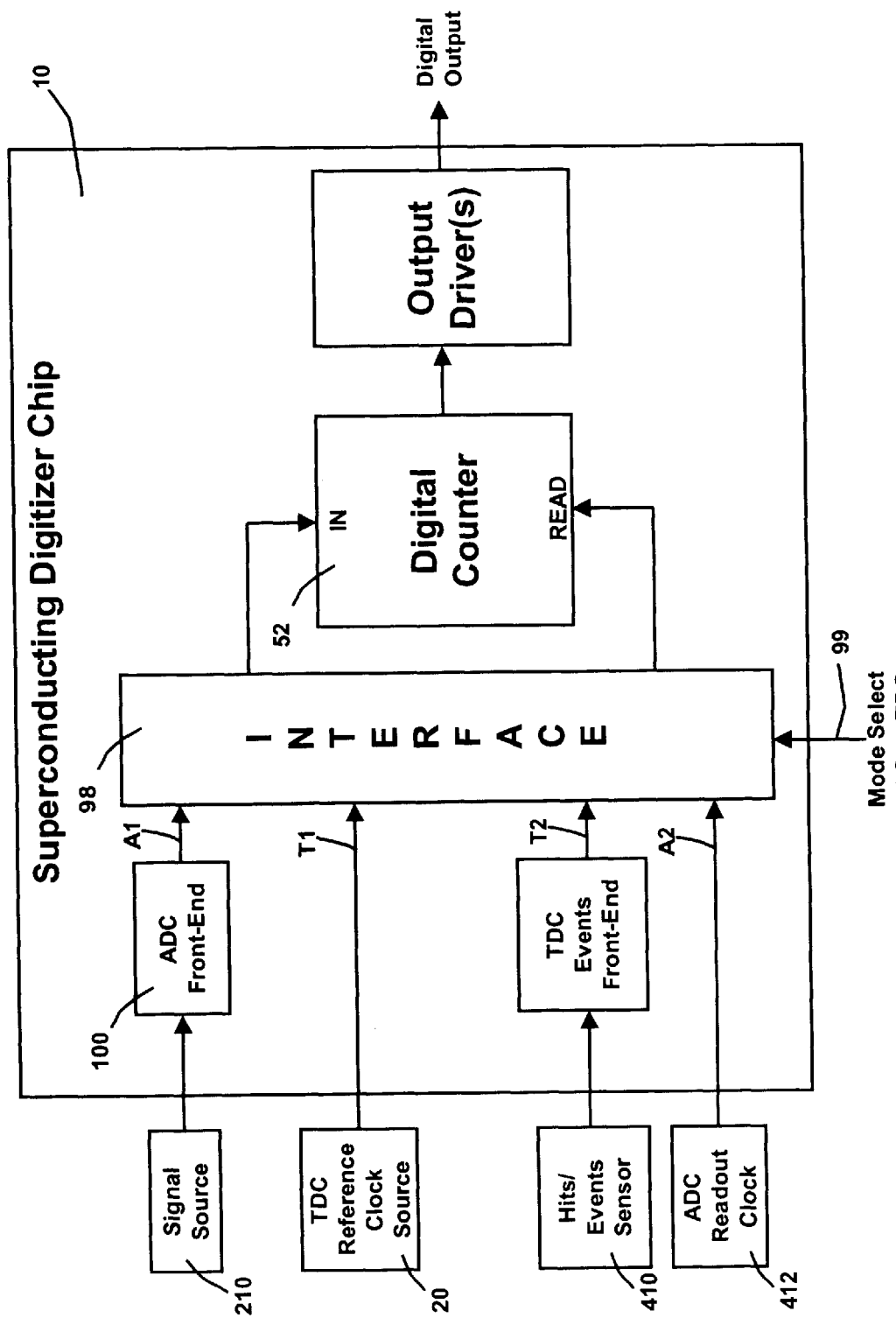

SUPERCONDUCTING DUAL FUNCTION DIGITIZER

BACKGROUND OF THE INVENTION

This invention relates to analog-to-digital conversion (ADC) and time-to-digital conversion (TDC) circuits.

Experimental High Energy and Nuclear Physics research depends heavily on the quality of measurement instrumentation. Better instrumentation enables better experimental results leading to advances in scientific knowledge. As the magnitude and complexity of these experiments continue to increase, the need for faster, more sensitive measurement electronics keeps growing.

Fast, low power, low noise, high sensitivity, and radiation resistant electronic instrumentation is essential for readout of particle detectors in experimental physics.

Detector readout instrumentation measures the timing, amplitude, integrated charge, and pulse shape of the detector response. Using a traditional readout method, the information content of low-level, fast signals from a detector is distorted by noise pick-up and crosstalk in analog transmission lines and by the amplifier noise. It is important to preserve the original signal quality. Conversion of the detector response into digital form also facilitates data acquisition and processing. Therefore, analog-to-digital conversion (ADC) and time-to-digital conversion (TDC) are two of the most important functions of detector instrumentation and, in particular, high energy physics detector instrumentation.

SUMMARY OF THE INVENTION

Applicants' invention resides, in part, in an improved dual function superconducting digitizer circuit which can selectively function either as an analog-to-digital converter (ADC) or as a time-to-digital converter (TDC). Superconducting ADCs and TDCs can provide performance far superior to that obtained using conventional electronics by taking advantage of the intrinsic properties—high switching speed, quantum accuracy, dispersion-less transmission lines, radiation hardness, and extremely low power dissipation—of superconductivity. Since both ADC and TDC functions are desired in most measurement systems, a dual-function digitizer is not only more attractive from a system integration perspective but is also more marketable.

In circuits embodying the invention there is included a common selectable interface circuit coupled between the output of an ADC Front-End circuit and a digital counter and between the output of a TDC Front-End circuit and the same digital counter. The interface circuit includes switches to cause: a) in the ADC mode, the output of the ADC front-end to be applied to the counter input with little noise and cross talk and a periodic (or sampling) READ clock to be coupled to the READ/SAMPLING input of the digital counter; and b) in the TDC mode, a periodic reference clock to be applied to the counter input and an aperiodic HIT/EVENTS signal to be coupled via the interface to the READ/SAMPLING input of the digital counter.

An analog-to-digital converter (ADC) embodying the invention samples the analog input signal generated by a detector at specified time intervals and produces a digital output corresponding to the amplitude of the analog input signal. An ADC for use in practicing the invention includes a SQUID front-end. In response to a current pulse at the output of the detector, the SQUID front-end acts as a charge-to-flux converter and produces a stream of single flux quantum (SFQ) pulses. The number of SFQ pulses produced is proportional to the electrical charge (current) generated by the detector. The SFQ pulses are supplied to a counter by counting the number (N) of pulses over a specified time interval (sampling or integration time), a digital count is produced which is proportional to the charge in that time interval. Not only can the total charge be calculated by summing these counts, but the pulse shape can also be determined by using a fast sample rate. The major advantages of this ADC implementation are high sensitivity (4 nA/LSB at 100 Msamples/s, corresponding to produce a stream of output SFQ pulses at the first output when the input signal increases in one direction A time-to-digital converter (TDC) embodying the invention also includes a TDC based SQUID front-end and is based on counting the number of clock cycles between a "start" event and a "stop" event. The resolution of the measurement is determined by a clock period. In the single hit case, a specified time trigger starts the TDC counter. Whenever a detector exceeds a specified threshold in a SQUID based front-end, a "hit" is registered by producing an SFQ pulse. This hit pulse stops the counter, producing a digital output corresponding to the time interval between the trigger and the hit events. The ability to operate the counter at extremely high frequency (>30 GHz with present technology) enables the use of a clock with a very short time period (~30 ps). While a time resolution of 30 ps is already very attractive, it can be further improved by measuring finer time intervals (limited by timing jitter of the circuit, 2–3 ps) within a clock period. Another advantage of Applicants' invention is that the same time resolution can be obtained in a multi-hit case. Each hit stops, resets, and restarts the counter. Therefore, when the next "hit" event occurs, the TDC output corresponds to the time interval between two successive hits.

Each one of the ADC and the TDC includes a SQUID-based front-end and a digital counter. The digital counter may include an N-stage serial binary counter, a buffer memory coupled to the binary counter comprised of M rows, each having N stages for enabling serial to parallel conversion from the binary counter to the buffer memory, and an N-stage counter coupled to the mth row of the buffer memory for performing a parallel-to-serial conversion.

The nature of the counter input and the counting interval is different in the two cases. In the case of the ADC, the counter counts a stream of pulses of varying frequency generated by, and from, the ADC front-end. In the case of the TDC, it counts a periodic (constant frequency) pulse stream generated by a reference clock source. The counter readout occurs at regular intervals for the ADC determined by a sampling (readout) clock, while the counting interval for the TDC is "aperiodic" since it depends on the occurrence of hits (start and stop triggers) at the TDC front-end. That is, for the ADC Counter there is periodic counting of an aperiodic stream of pulses and for the TDC Counter there is an aperiodic counting of periodic stream of pulses.

The ADC front-end, the TDC front-end, the selectable interface, the binary counter, and a multi-row memory buffer may be integrated on an IC chip which may also include a parallel-to-serial converter to the digital counter for a serial output version of the dual-function digitizer.

The IC chip may have two, or more, digitizer channels. Each channel can be used either as a TDC or as an ADC. Thus, with a single chip one can have a multi-channel high-sensitivity ADC, a multi-channel multi-hit TDC, or a combination of TDC and ADC channels.

Such flexibility is extremely important in high energy and nuclear physics instrumentation, allowing different measurements to be performed on the same setup. In accordance with Applicants' invention, multiple copies of these digitizer pairs may be integrated on a single chip, and multiple chips may be integrated on a superconducting multi-chip module (MCM) to customize the instrument for each application.

Applicants' invention thus includes a dual-function digitizer scheme, where the ADC and the TDC front-ends are connected to a common digital counter through a selectable interface. In accordance with the invention, an integrated circuit is formed that can selectively perform the functions of a sensitive analog-to-digital converter (ADC) as well as a high-resolution multi-hit time-to-digital converter (TDC).

BRIEF DESCRIPTION OF THE DRAWINGS

In the accompanying drawings like reference characters denote like components; and FIGS. 1 and 1A are simplified block diagrams of a system embodying the invention;

DETAILED DESCRIPTION OF THE INVENTION

Figure 1A:
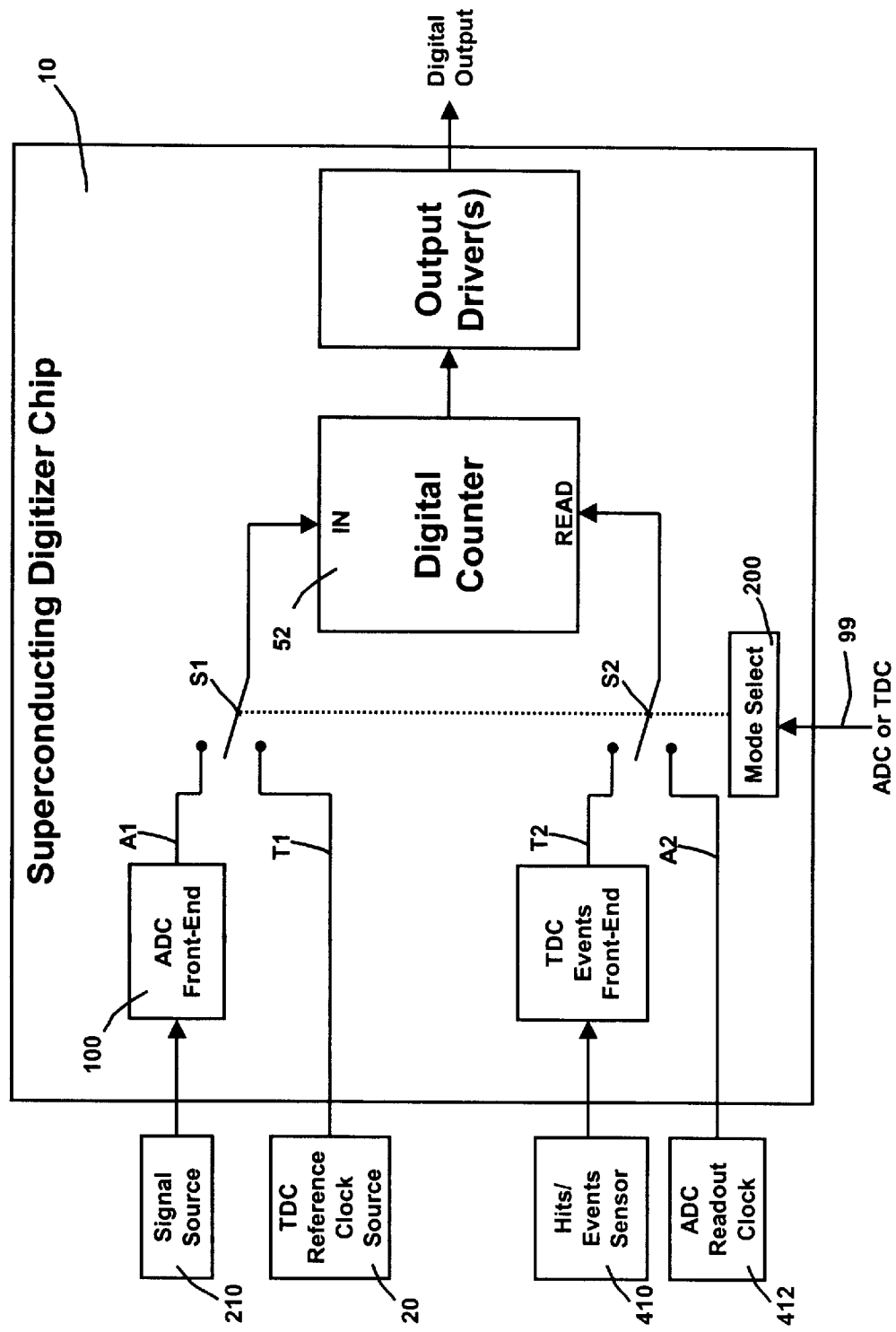

Referring to FIG. 1, there is shown a highly simplified block diagram of a superconducting digitizer chip 10 embodying the invention. An analog input signal derived from a detector 210 is applied to the input of a superconducting ADC front end circuit 100 whose output is connected to an output terminal A1. A normally high frequency reference clock signal derived from a signal source 20 is connected to an output terminal T1. A readout (sampling) clock signal derived from an ADC read out clock generator 412 is applied to a terminal A2. A Hits (Start/Stop) signal derived from a detector 410 is applied to a terminal T2. An interface circuit 98 is responsive to an ADC or TDC mode select signal (which may be a current signal) supplied on line 99. When a signal for operating the "ADC" mode is received, the interface circuit 98 respectively couples the output A1 and the output A2 to the "IN" input and the "READ/SAMPLING" input of a counter 52. When a signal for operating in the "TDC" mode is received, the interface circuit 98 respectively couples the output T1 and the output T2 to the "IN" input and the "READ" input of counter 52. As detailed below the counter 52 is common to, and used for, both modes of operation.

Referring to FIG. 1A, there is shown a simplified switching arrangement for performing the desired interface functions. An analog input signal derived from detector 210 is applied to the input of the ADC front end circuit 100 whose output is connected to an output terminal A1. The reference TDC clock signal from signal source 20 is connected to output terminal T1. A switch S1 responsive to a signal from a mode select circuit 200 functions to connect terminal A1 or terminal T1 to the "IN" input of digital counter 52. A readout (sampling) ADC clock is applied to a terminal A2 and a Hits (also referred to as a Start/Stop or Event) signal is applied to a terminal T2. A switch S2 responsive to a signal from mode select circuit 200 functions to connect terminal A2 or terminal T2 to a control input (READ) of digital counter 52. When the circuitry on the chip is selected to function as an ADC switches S1 and S2 are connected to terminals A1 and A2, respectively. When the circuitry on the chip is selected to function as a TDC, switches S1 and S2 are connected to terminals T1 and T2, respectively. As further detailed below, in the ADC mode the digital counter 52 periodically counts an aperiodic stream of pulses generated by the ADC front end in response to analog input signals from detector 210. In the TDC mode the digital counter 52 aperiodically counts periodic stream of pulses. The use of the same digital counter for the two different operating modes provides a very versatile chip with efficient use of components and power.

Figure 1B:
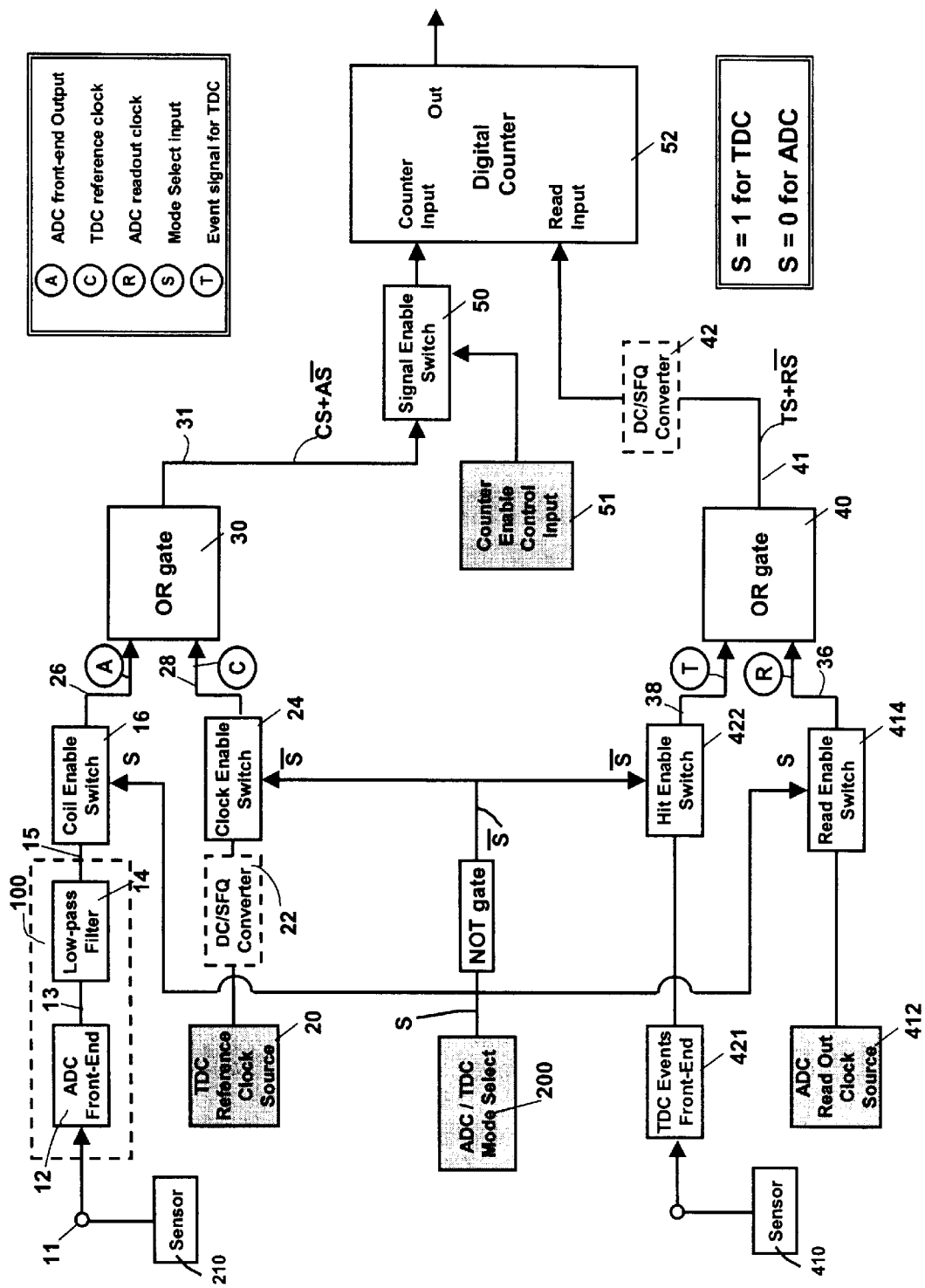
FIG. 1B is another block diagram of a circuit embodying the invention.
Figure 7:
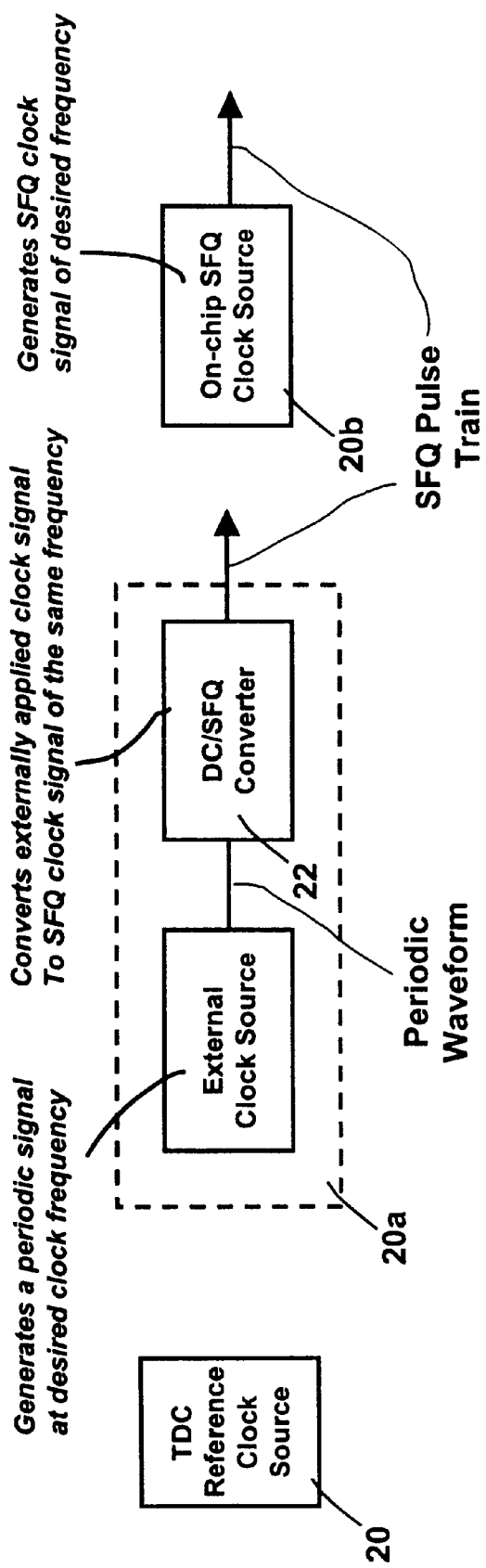
FIG. 7 is a block diagram of different high frequency reference clock sources for use in systems embodying the invention.

A more detailed block diagram is shown in FIG. 1B which illustrates that the ADC front end circuit 100 may include an ADC front end coil section 12 and a low pass filter 14. In FIG. 1B an analog input signal derived from detector 210 is applied to analog signal input terminal 11 which is coupled to the input of ADC front end coil section 12 having an output 13 connected to an input of a low pass filter 14 whose output is fed to a terminal 15 corresponding to terminal A1 of FIGS. 1 and 1A. A switch 16, also identified as a coil enable switch, is connected between terminal 15 and one input 26 of a two-input "OR" gate 30, also identified as a "confluence buffer". In response to a control signal S from mode select circuit 200 the output at A1 is selectively coupled to input 26 of confluence buffer 30 which functions essentially as a two-input OR gate. Another signal input to circuit 30 is the clock signal, C, which is obtained from reference clock generator 20 whose clock output is supplied to the input of DC/SFQ converter 22 whose output is then coupled via a switch 24 to input 28 of OR Circuit 30. The DC/SFQ converter may be omitted when the TDC reference clock source 20 is an on-chip SFQ clock source 20$b$ (FIG. 7). Switch 24 is shown connected between the output of converter 22 and the input 28 of OR gate 30. However, switch 24 could be connected between terminal 21 and the input to converter 22. The turn-on and turn-off switch 24 is controlled by a signal (S-bar) from mode select 200. To reduce cross talk and noise switches 16 and 24 may be unidirectionally conducting, as discussed below.

The output 31 of OR-gate 30 is connected to the input of a signal enable switch 50 which, when enabled, allows the output of OR gate 30 to be supplied to the "IN" (counting) input of digital counter 52. Signal enable switch 50 is used to reduce the likelihood of stray or noise pulses being introduced into counter 52. Switch 50 may be turned on and off by a counter enable control circuit 51 which may be responsive to signals external to the chip or internal to the chip. Switch 50 is preferably a unidirectional switch and may be of the type shown in FIG. 5.

The ADC sampling clock signal from ADC readout clock circuit 412 is coupled to the input of a switch 414 whose turn-on and turn-off is controlled by an output signal (e.g., S) from mode select 200. When switch 414 is turned on, the ADC read-out clock signal is applied to one-input 36 of a two-input OR-gate 40 which may be, but need not be, similar to confluence buffer 30. The output of the TDC events sensor 410, which may be the same as detector 210, is shown coupled via TDC front-end circuit 421 to the input of a switch 422. The turn-on and turn-off of switch 422 is controlled by a signal (S-bar) from mode select 200. When switch 422 is enabled (turned on) the output of events sensor 410 is coupled to input 38 of OR gate 40. The output of OR-gate 40 is applied to the input of a DC/SFQ converter 42 whose output functions as a sampling signal, applied to the "READ" or "SAMPLING" input of digital counter 52. Converter 42 may not be needed when two separate DC/SFQ converters are placed either before or after the Hit Enable Switch 422 and either before or after the Read Enable Switch 414.

Mode select circuit 200 produces a signal "S" shown applied to switches 16 and 414 and a signal "S-bar" shown applied to switches 24 and 422. These signals control input signals which are applied to OR circuits 30 and 40 and therefore determine whether (a) the output of the ADC 12 or (b) the output of the TDC reference clock source is coupled via OR gate 30 and via signal enable switch 50 to the "IN" input of digital counter 52; and determine whether: (a) the output of the hits/events sensor 410: or (b) the output of the ADC read out clock 412 is applied via OR gate 40 and via DC/SFQ converter 42 to the "READ" input of digital counter 52.

The circuits of FIGS. 1, 1A and 1B can be operated to function as an ADC or as a TDC. In the ADC mode (as further detailed in FIG. 2) a detector 210, which senses and produces an analog output signal whose amplitude is to be converted, is coupled to the input of ADC front end coil section 12. The amplitude of the analog input signals applied to section 12 is converted into a pulse train whose pulses per unit of time (frequency) are a function of the amplitude of the analog input signal. The input stage of an ADC suitable for use in circuits embodying the invention is shown in FIG. 2.

Figure 1C:
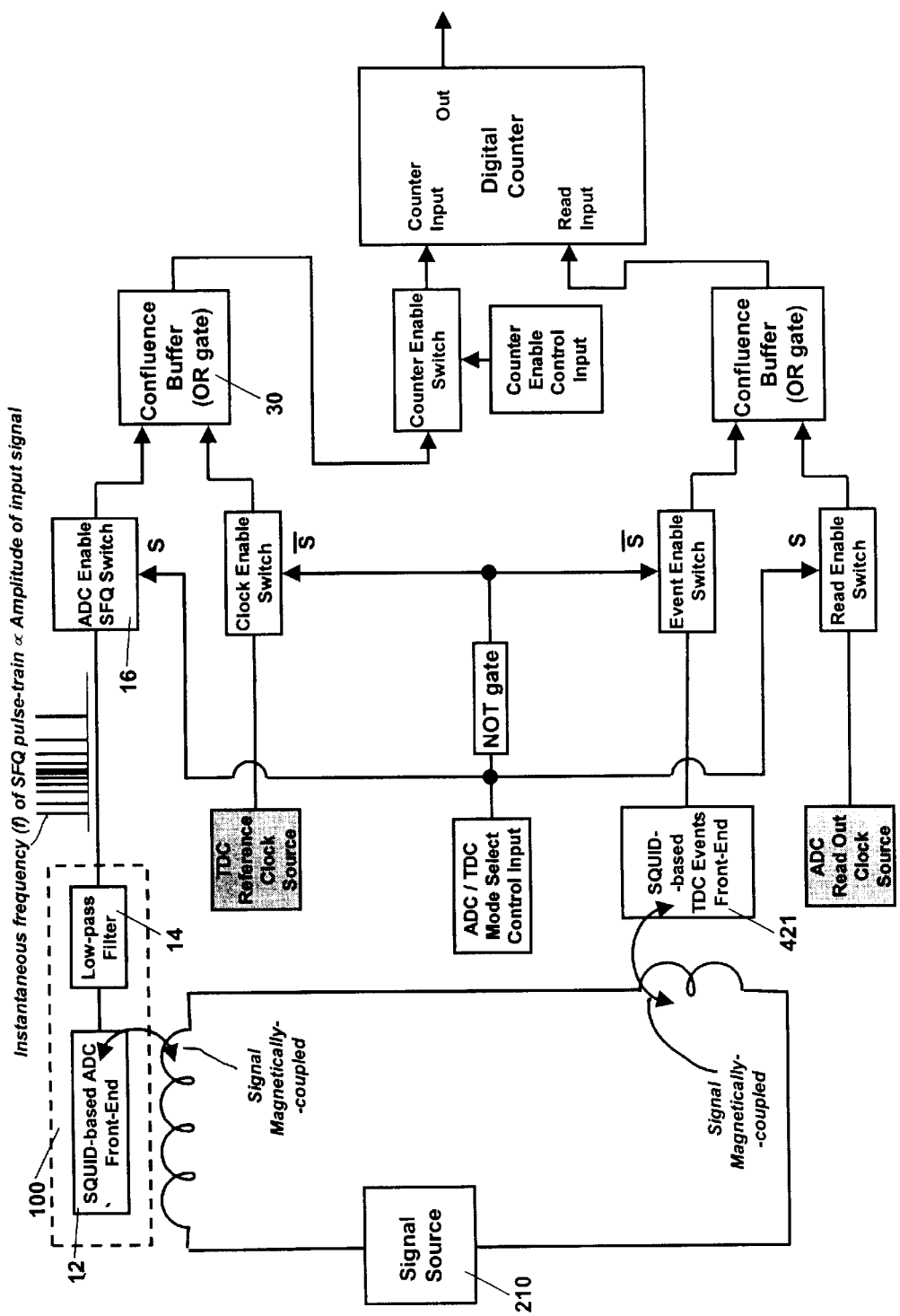
FIG. 1C is a block diagram of a circuit embodying the invention in which the output of a signal source is selectively processed via an ADC channel or a TDC channel.

FIG. 1C illustrates how an input signal produced by a signal source 210 may be magnetically coupled to the SQUID-based ADC front-end 12 or to a SQUID-based TDC Events front-end circuit 421. In the ADC mode, the amplitude of the input signal is captured and processed by the digitizer. In the TDC mode, the time between input signals (hits or events) is ascertained.

Figure 2:
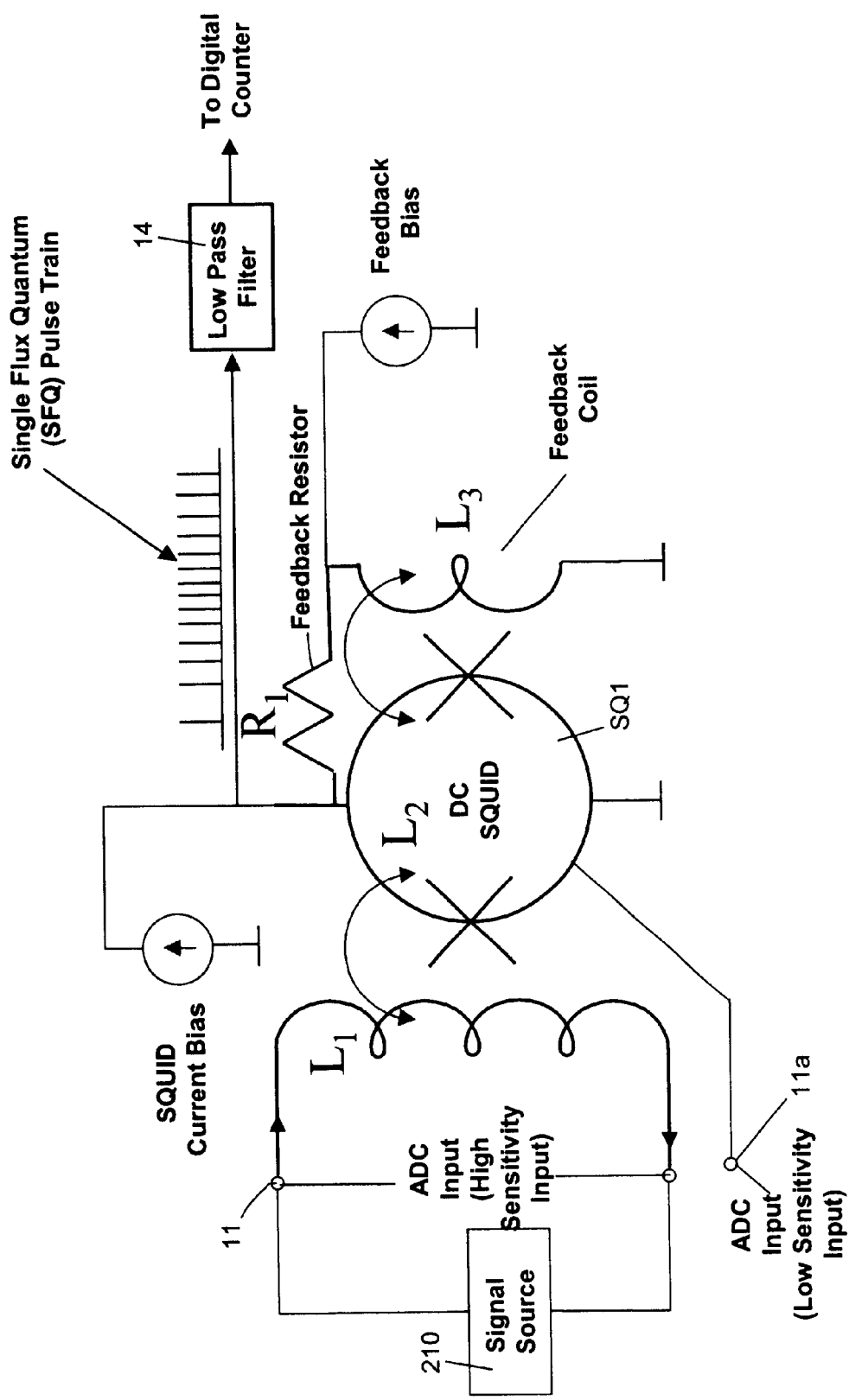
FIG. 2 is a partial schematic, partial block, diagram of a SQUID based ADC Front-End suitable for use in systems embodying the invention.

The basic sensitive ADC architecture is shown in FIG. 2. The front end of the ADC coil section 12 includes a superconducting quantum interference device (SQUID), SQ1. The SQUID, SQ1, is magnetically coupled to an input coil L1 connected to the signal source. The ADC front-end SQUID, SQ1, has to be very sensitive to provide sufficient resolution for outputs of cryogenic detectors (e.g., 210). In one embodiment, the ADC SQUID has a 4-hole 120 turn transformer coupling the input signal to a SQUID, SQ1. Note that, alternatively, the signal source 210 may be connected to a terminal 11a which provides direct coupling into the SQUID loop. This input (i.e., 11a) provides lower sensitivity than the input at terminal 11 to which coil L2 is connected. An on-chip feedback network comprised of feedback resistor R1 and feedback coil L3, linearizes the voltage-flux characteristics of the SQUID. The ADC transformer (coils L1 and L2) may produce unwanted resonance, which can manifest itself as noise when coupled into the digital part of the circuit. Moreover, the ADC front-end output may interact with the TDC in the interface. Therefore, the selectable interface is designed to include strategically placed switches to avoid these unwanted effects. The analog-to-digital conversion may be accomplished as follows. First, a current caused by the signal source is produced in the input coil. This current, is amplified in the coil which is coupled to the SQUID, SQ1. This current signal may be in the form of a pulse, corresponding to the charge collected in a detector 210, which equals the time integral of that current pulse. Then, there is conversion of current to magnetic flux in that the current pulse produces magnetic flux in a secondary coil SQUID SQ1. Then, there is the conversion of magnetic flux to voltage in that the SQUID SQ1 converts the magnetic flux into voltage. Then the SQUID causes the voltage to be converted to SFQ pulses. A stream of single flux quantum (SFQ) pulses, with a frequency proportional to this voltage (AC Josephson effect) is launched by the SQUID into a low-pass filter 14. In FIG. 2, the SQUID output is shown coupled to a low pass filter 14 to interface with the counter 52 to make a complete digitizer. Low pass filter 14 is added to allow better isolation of the high-frequency resonant oscillations from the ADC front-end 12. The SFQ pulses are then counted in a binary digital counter 52. The digital counter (which functions as an integrator) counts the number of SFQ pulses over a certain time-period. The instantaneous rate (or frequency) of this SFQ pulse stream is directly proportional to the input current. Therefore, the number of SFQ pulses in a time interval is proportional to the electrical charge through the primary coil in that time interval. This integration is performed by counting the number of SFQ pulses over a sampling interval or integration period (t), determined by an external "readout clock" (e.g. 412).

As already noted, the ADC mode may be selected by applying a current signal to the input of mode select 200. The analog input signal may be applied either directly to the secondary coil (i.e., terminal 11a) of the front-end SQUID (low-sensitivity input), or through the multi-turn primary coil magnetically coupled to the SQUID (high-sensitivity input, i.e., terminal 11). Tests performed showed that the sensitivity ratio between the two inputs were 100:1 for one design of the front-end 12. The periodicity of the V-Φ curve was about 1.5 $\mu A/\Phi_0$ and 150 $\mu A/\Phi_0$ for the high-sensitivity and the low-sensitivity inputs respectively.

The ADC circuit has been shown to work for both dc and pulsed input current signals. In the dc case, a constant current was applied and the number of counts was measured between two ADC Read pulses. By varying this constant applied current, the periodic V-Φ curve of the ADC could be traced out, using the Josephson relation to derive the equivalent SQUID voltage (V) from the digital count in a counting period (T). These measurements for varying amount of SQUID bias currents and the Feedback bias (adding a current to the feedback coil directly) confirms the correct operation of the ADC for dc levels.

Figure 2A:
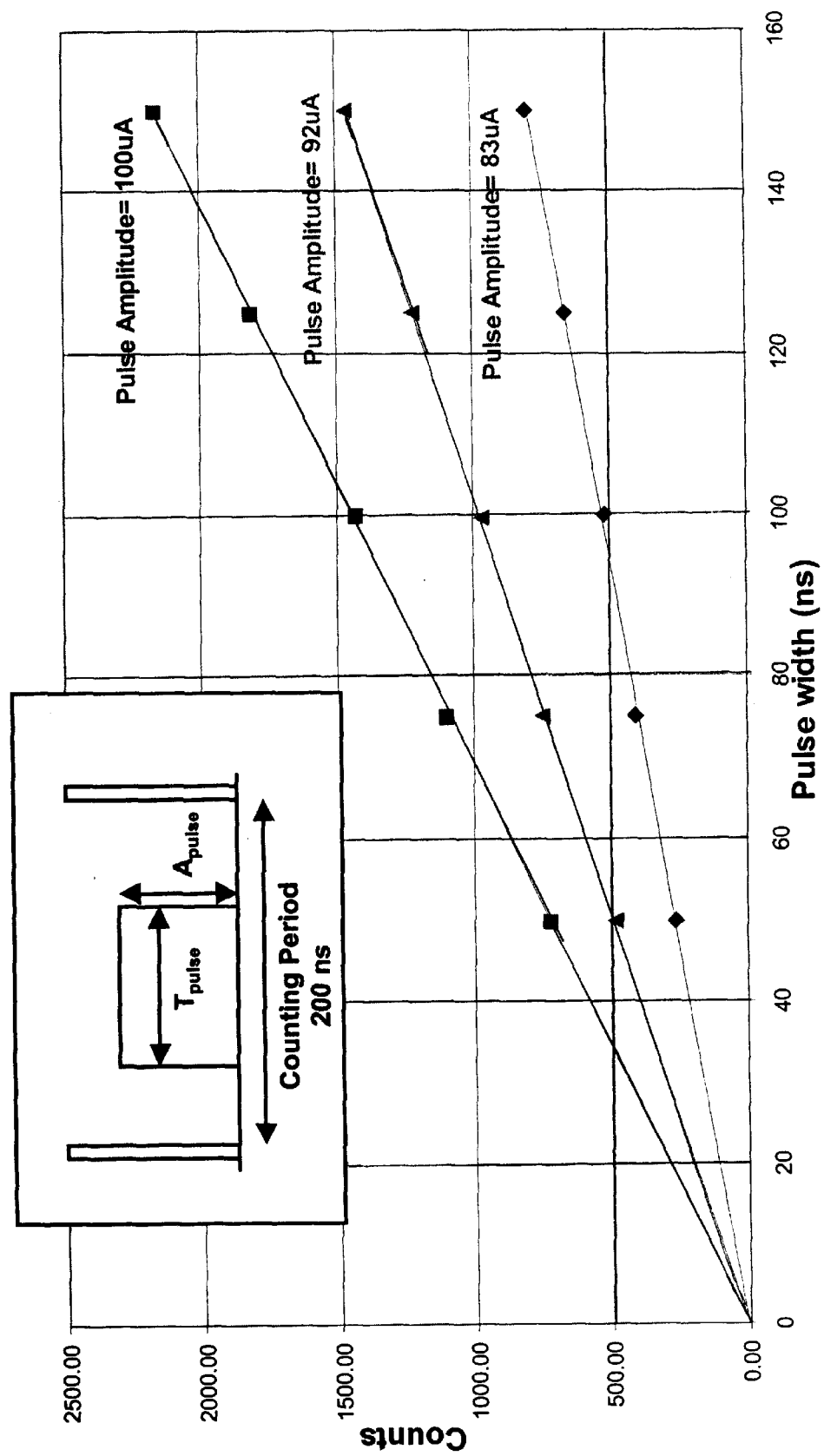
FIG. 2A is a diagram of the time integral response of the circuit to some test conditions.

In the pulsed input test, a current pulse of variable width ($T_{pulse}$) and amplitude ($A_{pulse}$) was applied within a counting period. Here the output count represents the total charge of the pulse. FIG. 2A shows the ADC output for three different pulse amplitudes each for five different pulse widths. The linear curve fits through the count outputs for the same amplitude and different widths is also shown. This test confirms the ability to digitize the charge of a pulse.

Figure 3A:
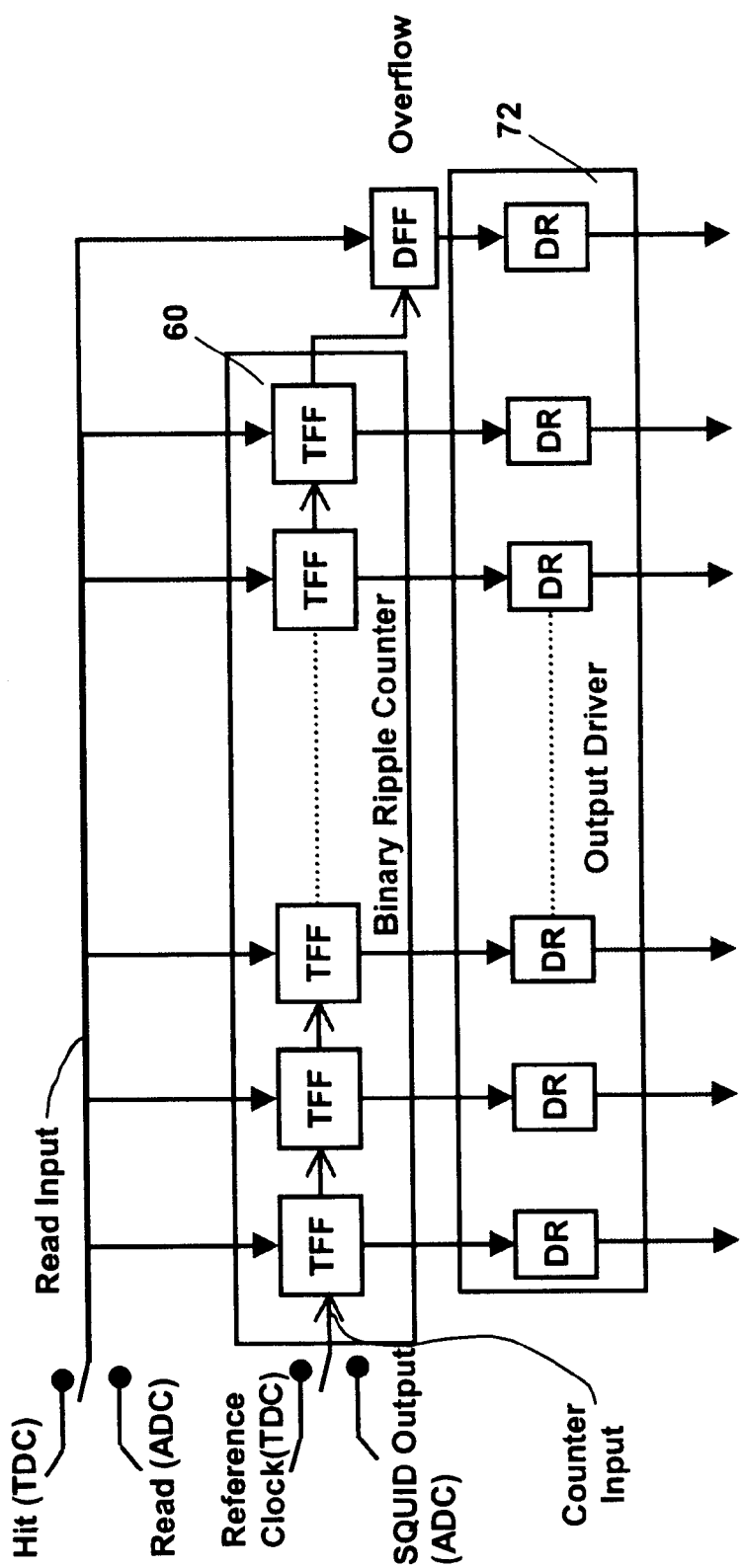
FIGS. 3A, 3B, 3C and 3D are block diagrams of parts of different counter arrangements suitable for use in systems embodying the invention.
Figure 3B:
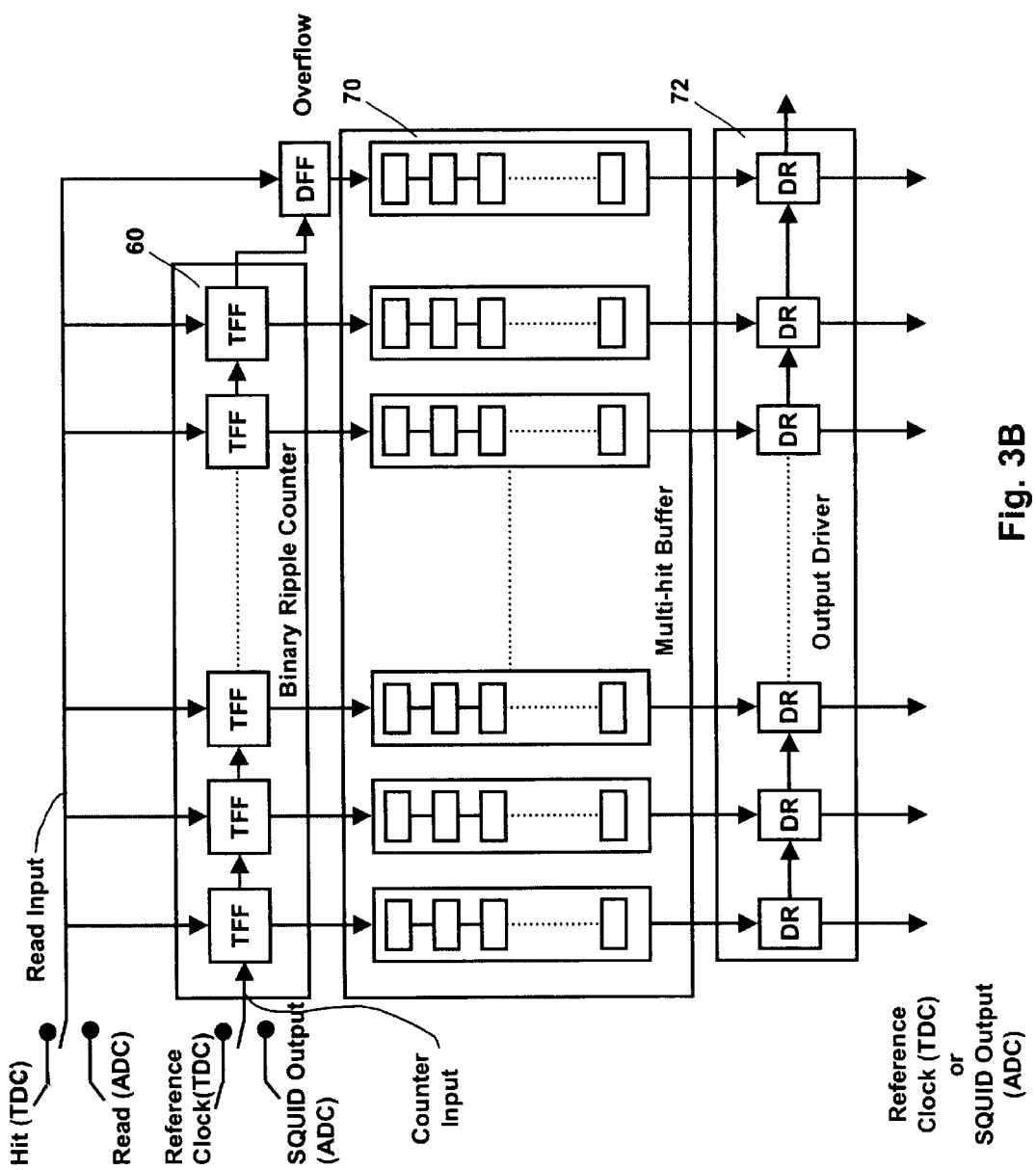
Figure 3C:
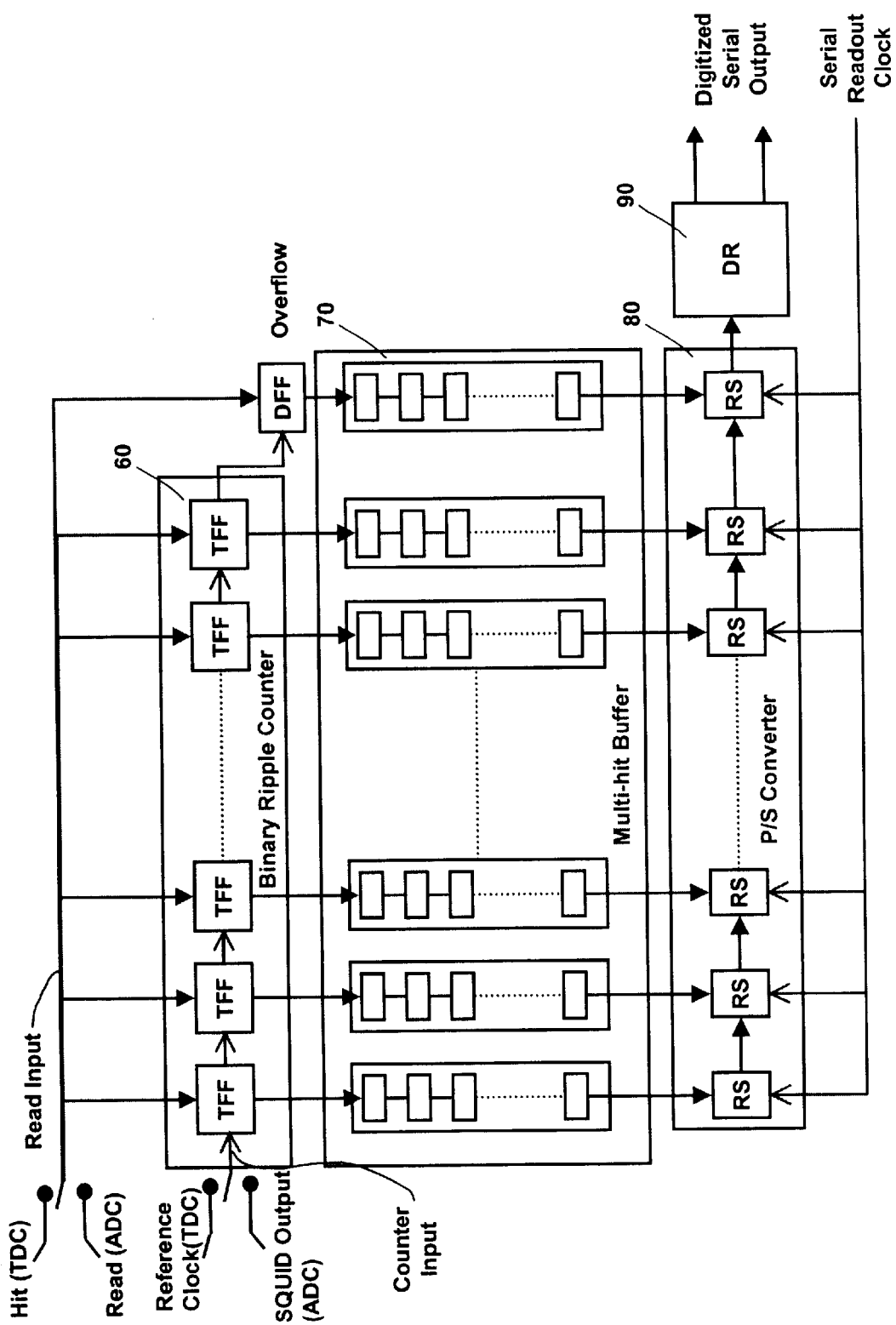
Figure 3D:
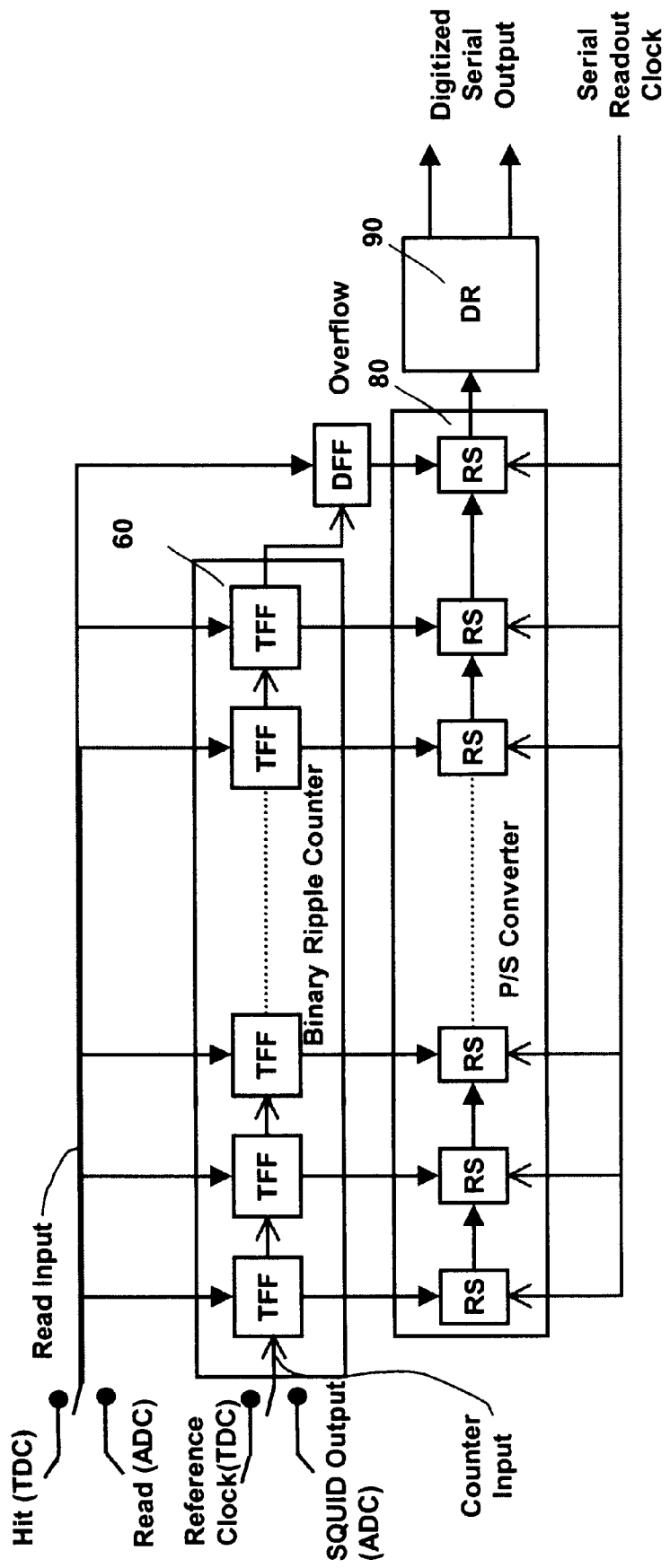

Referring to FIGS. 3A, 3B, 3C and 3D, more detailed block diagrams of different configurations of counter 52 are shown. The counter 52 includes an N-stage binary counter 60 (e.g., a 16-bit counter(15-bit with 1-bit overflow) made up of toggle flip-flop (TFF) forming a ripple down binary counter. Each counter stage is coupled to an array of output drivers (DR) for producing N parallel outputs, one per stage. In FIG. 3B, the counter 52 includes counter 60 and an m-row memory buffer 70, with each row of the memory buffer having N stages. In FIG. 3B, the output of each column (i.e., each Nth stage) of the memory is coupled to an input driver from an array 72. In FIG. 3C, the outputs of an N-stage binary ripple counter 60 are coupled to m-row buffer 70 whose outputs are to a parallel-to-serial (P/S) converter 80 whose output is coupled to a Differential output driver 90. In FIG. 3D, the outputs of the N-stage buffer are directly connected to the inputs of a P/S converter 80.

The ADC/TDC interface 98 allows either: a) the ADC front-end output (asynchronous SFQ pulse train) at terminal A1 to be coupled/decoupled to/from the "IN" input of binary counter 60 and the output of the ADC READ OUT clock at terminal A2 to be coupled to the "READ" input of binary counter 60; or b) the TDC clock at terminal T1 to be coupled/decoupled to/from the "IN" input of counter 60 and the TDC HIT output at terminal T2 to be coupled/decoupled to/from the "READ" input of counter 60. In one embodiment the counter 60 consisted of 16 binary stages. But it should be evident that the binary counter 60 could be made to include many more (or less) stages. In FIGS. 3B and 3C, the counter 52 is followed by a multi-hit buffer 70 of "m" rows, with each one of the "m" rows having a stage corresponding to a stage of the binary counter 60; where "m" may be any integer greater than one. The binary counter 60 is followed by a multi-hit memory buffer to store multiple output words. In the dual-function digitizer, this counter 60 has compatibility with the memory buffer 70 layout. The counter consists of simple toggle flip-flop (TFF) cells, which have been individually shown to operate up to 120 GHz. As shown in FIGS. 3C and 3D, the digital counter may also include a parallel-to-serial (P/S) converter 80 that allows the reduction of the number of output lines. The P/S converter 80 may be the last row of the multi-hit buffer (e.g. the $3^{rd}$ row of a 3-row buffer) that can be clocked out serially. FIGS. 3B and 3C show a block diagram of the digital counter section of the circuit, including a multi-hit memory buffer and a parallel-to-serial (P/S) converter. The outputs of the digitizer are in the form of low-level (mV) signals that need to be amplified for compatibility with other electronics at room temperature. Differential output drivers are preferable for rejection of common-mode noise pick-up in cables connecting the cryogenic digitizer chip to room temperature circuits. However, the doubling of the number of output lines for a differential output scheme (as shown in FIGS. 3A and 3B) would exceed the number of pads available in most standard chip and test probe design. Moreover, for eventual instrument development on a closed-cycle cryocooler the number of output lines should be kept at a minimum to reduce the heat load. The heat load of a cryocooler is dominated by the heat leak through input/output cables since the superconducting chips themselves dissipate only 1–2 mW per chip. Lower heat load directly translates to smaller size, lower input power requirement, and lower cost for cryocoolers. Therefore, circuits embodying the invention (as shown in FIGS. 3C and 3D) may include a P/S converter 80 to serialize the digital output from the multi-bit buffer. A small differential output driver 90 is used to amplify the counter output for easier room-temperature interface.

In one embodiment, a 15-bit toggle flip-flop (TFF) counter 60 counted the stream of SFQ pulses—either from the ADC front-end or from the reference clock source—between read or hit events for the ADC and the TDC operations, respectively. For this particular embodiment, if the count is greater than $2^{15}$, the overflow ($16^{th}$) bit is set to "1", to indicate a counter overflow. A 3-row memory buffer can store up to 3 counts. Note that the counter includes circuitry for causing the signals to flow selectively from row to row of the buffer 70 and from the last row to the output stage. This circuitry is not explicitly shown as it is generally known to have serial-to-parallel and parallel-to-serial schemes.

Figure 4:
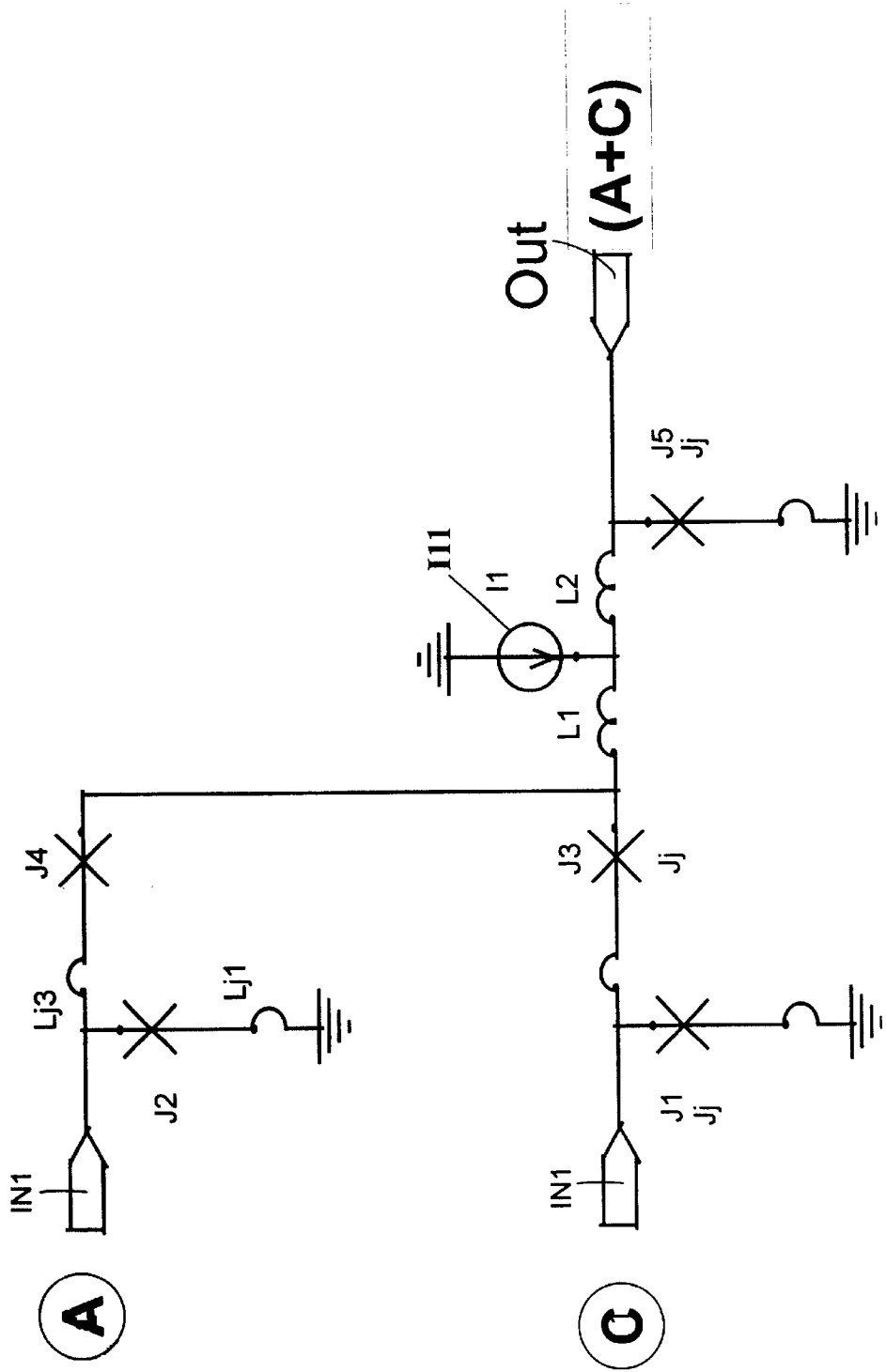
FIG. 4 is a schematic diagram of a confluence buffer (OR gate) suitable for use in systems embodying the invention.

Two-input OR gates 30 and 40, which may also be denoted as confluence buffers, may have the configuration shown in FIG. 4. Input signals to be OR'ed are applied to the terminals identified as IN1 (e.g., 26 or 36 in FIG. 1B) and IN2 (e.g., 28 or 38 in FIG. 1B). The OR gate includes a current bias source I11. The OR gate may be activated or deactivated by controlling the current I11. Thus by controlling the current source the active range of operation of the OR gate may be controlled. An OR'ed output is available at the output (e.g., 31 or 41) of the gate. As formed the OR gate conducts unidirectionally.

Figure 5:
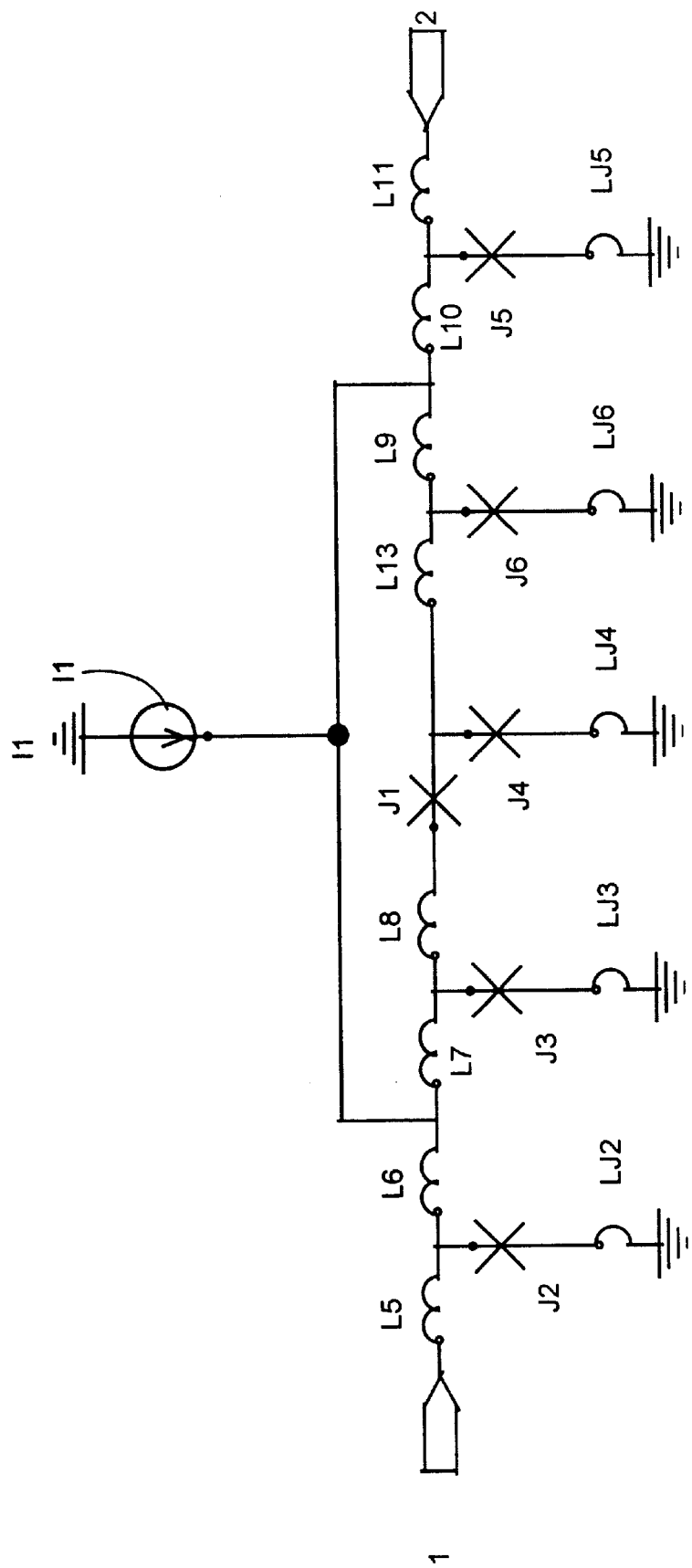
FIG. 5 is a schematic diagram of a switching circuit suitable for use in systems embodying the invention.

Switches 16, 24, 414, 422 and 50 may have a configuration similar to that shown in FIG. 5. The enabling signal to each switch includes means for supplying a bias current I1. When this current I1 is supplied the switch functions as a unidirectional switch for passing (propagating) the signals at its input to its output. When the current I1 is not supplied the switch acts as an open and does not allow the passage of the signals present at its input to pass to its output.

In the ADC mode, the instantaneous frequency of the SFQ pulse stream produced by the ADC SQUID is modulated by the applied (analog) input signal. In each readout interval, determined by the frequency of the readout clock generator, the number of pulses in this asynchronous SFQ pulse stream is counted and a corresponding digital word is produced at the counter output. In the ADC case, the counter counts an asynchronous (aperiodic) pulse stream at regular ("periodic") intervals. The situation is reversed in the TDC mode, where a synchronous (periodic) pulse stream is counted at irregular ("aperiodic") intervals, determined by the arrival of "Hit" signals from the TDC front-end circuit 421.

As shown in the Figures, for the ADC operation, the counter 52 counts the number of SFQ pulses (A pulses) produced by the ADC SQUID between successive readout clock pulses (READ). For the TDC operation, the counter 52 counts the number of SFQ pulses (C pulses) produced by the reference clock generator between successive "Hit" signals (T2). Therefore, when the user wants to choose the TDC function, the mode select circuit causes the interface 98 to choose signals T1 ("C") and "T2" ("T") to be applied to the "IN" and the "READ" inputs of the counter 52, respectively. On the other hand, if the user selects the ADC function, the interface chooses signals "A1" ("A") and A2 ("R") to be applied to the "IN" and "READ" inputs of counter 52, respectively.

As noted above, a common interface 98 couples the ADC and the TDC front-ends to the digital counter 52. The interface may include switches to allow the output of either the ADC front-end or the TDC front-end to be applied to the counter input.

The ADC front-end, the TDC front-end, the selectable interface, the binary counter, and the multi-hit memory buffer may be integrated on a single IC. The IC may also include the parallel-to-serial converter coupled to the binary counter for producing a serial output version of the dual-function digitizer.

Figure 6:
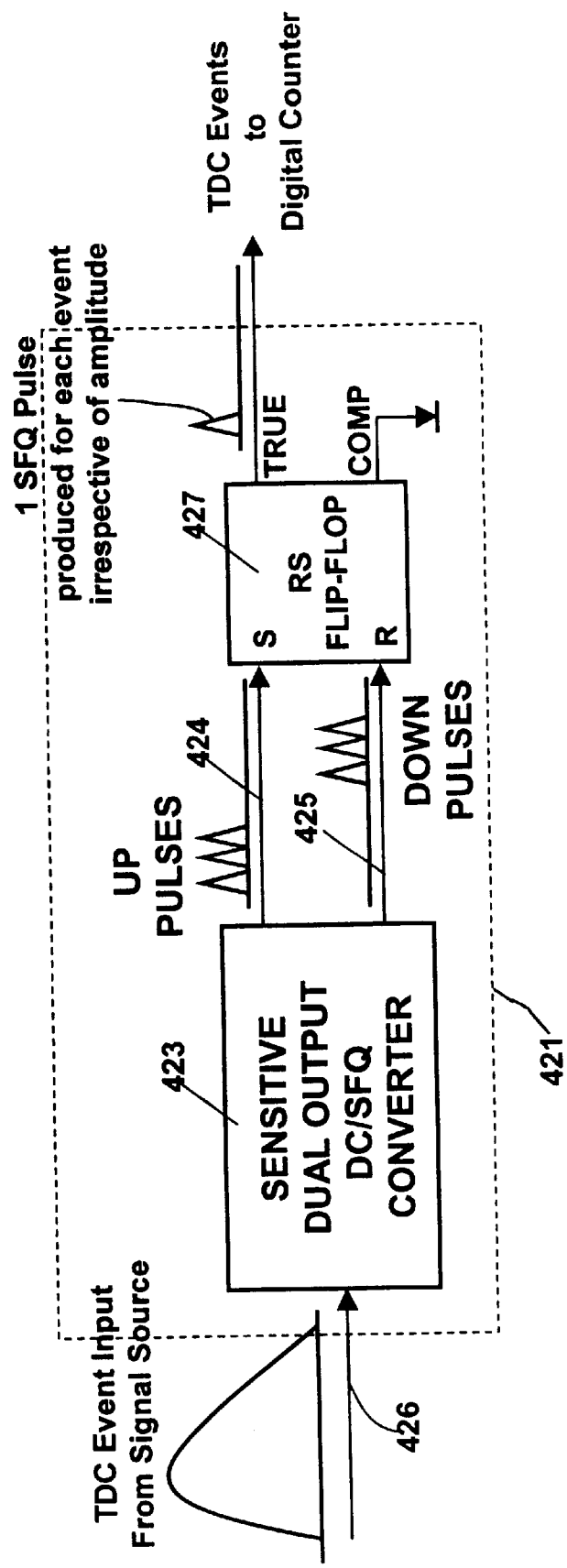
FIG. 6 is a block diagram of a TDC front-end circuit embodying the invention.
Figure 6A:
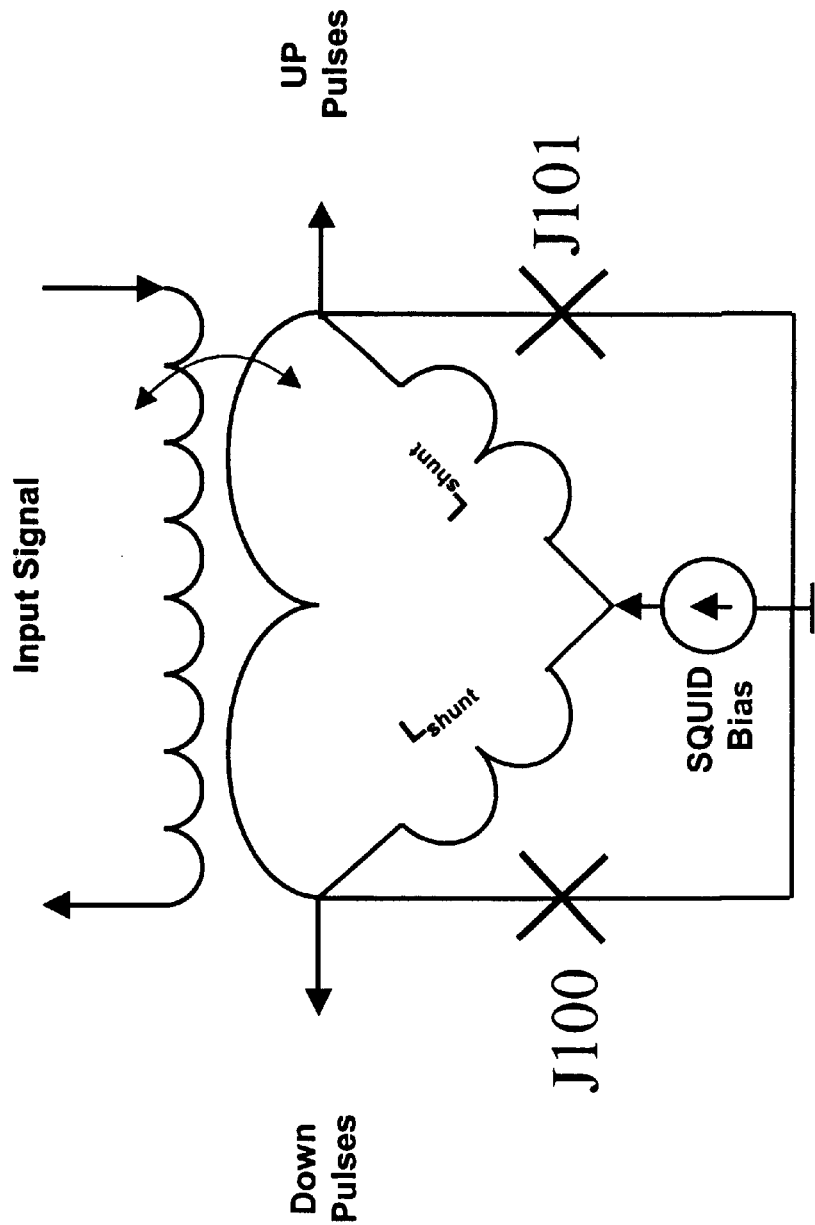
FIGS. 6A and 6B are schematic diagrams of part of the circuit of FIG. 6.
Figure 6B:
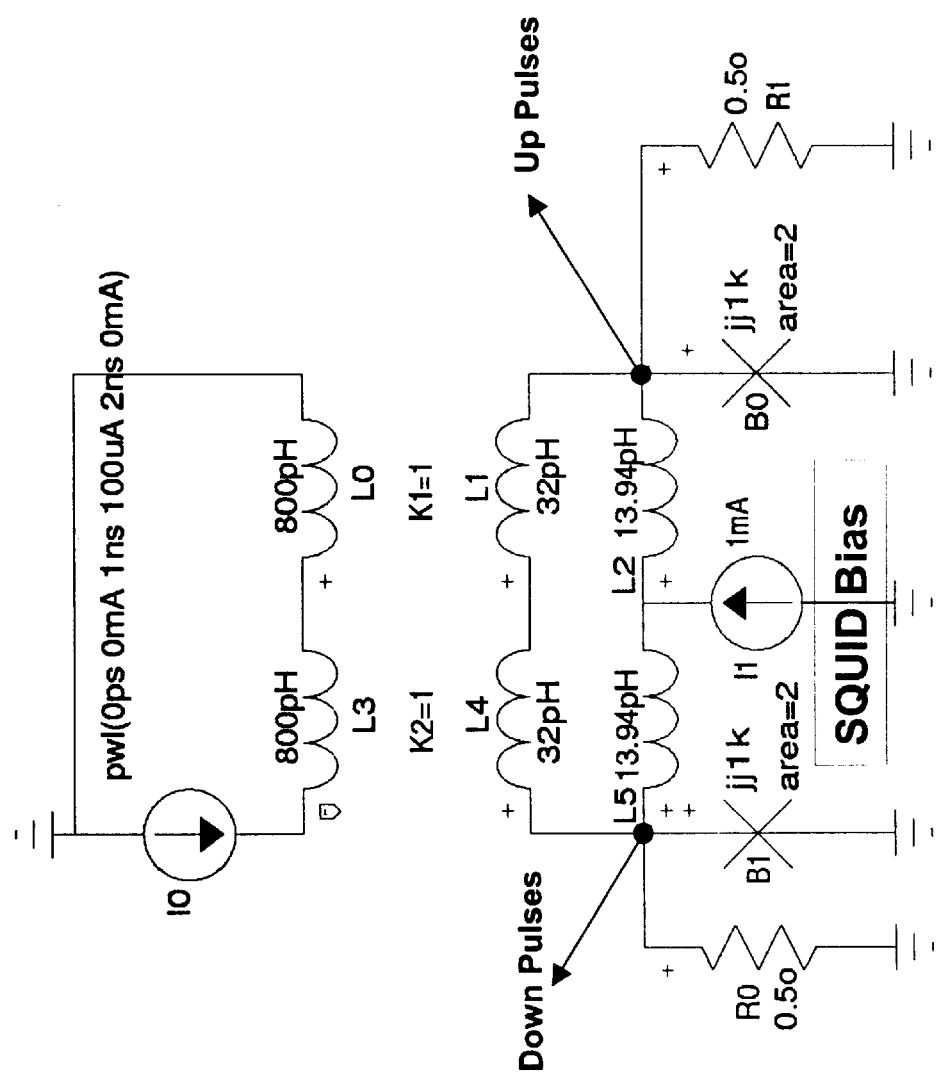

A TDC front-end 421 suitable for practicing the invention may be further detailed as shown in FIG. 6. The TDC front-end 421 may include a sensitive dual output DC/SFQ converter 423 having a first (e.g., Up pulses) output 424 and a second (e.g., Down pulses) output 425. The first and second outputs are then supplied to the set (S) and reset (R) inputs of an RS flip-flop 427. The circuit of FIG. 6 is such that whenever an input signal applied to the input 426 of converter 423 exceeds a given threshold level, a single SFQ pulse is produced at the output of RS flip-flop 427. This is so, even if the input pulse is of large amplitude and duration. Thus, for each event/hit signal at the input 426 irrespective of amplitude one SFQ pulse is produced at the output of the TDC front-end converter 421. It should be appreciated that if the input signal at 427 is larger than a prescribed level, the DC-to-SFQ converter produces multiple single flux quantum pulses, instead of generating only one single flux quantum pulse as desired. To filter out these parasitic pulses, the dual output DC/SFQ converter 423 is used with an RS flip-flop connected to its output terminals. Not only does the device have a bigger dynamic range, but more precise measurement of the moment in time of the pulse arrival may also be obtained. The DC to SFQ converter may be represented as shown in FIG. 6A and in greater detail as shown in FIG. 6B.

The converter 423 may be a dual output SQUID, which may be termed a quantizer since it produces a quanta of magnetic flux or a DC/SFQ converter. The output(s) of the converter 423 are applied to the inputs of an RS flip flop 427. The SQUID as shown in FIGS. 6A and 6B includes two Josephson junctions J100 (or B1) and J101(or B) to which input signals are magnetically coupled (e.g., L0, L1 and L3, L4 in FIG. 6B) with additional coupling via $L_{shunt}$ (e.g., L3, L5). The application of input signals causes the infusion of flux into the SQUID which causes the SQUID to be driven across lobes in its threshold characteristic, which in turn causes the production of an SFQ pulse as each boundary is crossed. The SQUID can produce two streams of SFQ pulses, one stream, at one output, on the rising edge of an input signal; and another stream, at the other output, on the falling edge of an input signal. Thus, on the rising edge of a pulse a stream, or bunch, of pulses is produced at one output (e.g., UP) of the SQUID and on the falling edge of the pulse another stream of pulses is produced on the other output (e.g., DOWN) of the SQUID. The number of SFQ pulses produced at each output is equal to the number of thresholds (or "SQUID lobes" ) crossed. For example, Applicants made a design where each threshold corresponded to an input current level of 20 microamperes and another design where each threshold corresponded to 30 microamperes by varying the value of $L_{shunt}$. The RS flip-flop functions to let through the first pulse in a stream of pulses and to reject all the remaining pulses in the stream.

By way of example, as shown in the figures, the UP pulse output is connected to the set (S) input of the RS flip flop and the DOWN pulse output is connected to the reset (R) input of the RS flip flop. [The connections could be the other way around.] The first SFQ pulse in an UP bunch of pulses sets the flip-flop to "1" state and produces an output SFQ pulse at the TRUE output of the flip-flop. The flip-flop will then remain in the "1" state until the flip-flop receives an input signal at the reset input. Therefore, all subsequent SFQ pulses after the first pulse and until the flip flop is reset do not produce an output signal and are effectively block or rejected. Similarly, the first pulse in a bunch of down pulses resets the flip-flop to the "0" state and produces an output SFQ pulse at the at the COMP (complementary) output. The RS flip-flop will then remain in the "0" state until the flip-flop receives an SFQ pulse at the set input. Thus, all SFQ pulses in the DOWN bunch after the first pulse find the flip flop in the "0" state and do not produce an output.

In those cases where it is desirable to detect when the input signal exceeds a threshold level and when the signal drops below the threshold level the TRYE and the COMP output of the flip-flop 427 are used. The threshold of the SQUID 421 is designed to be sensitive to sense the lowest signal value to be recognized; but it can not be too sensitive to prevent noise signals from generating spurious outputs. This is accomplished by appropriate designing of the transformer coupling the magnetic flux into the SQUID.

TDC Mode:

When the signal (e.g., no current) applied to the Mode Select 200 causes it to set the digitizer to act as a TDC, the operation of the system may be as follows. The output of the reference clock 20, which may be a sinusoidal source, is coupled, either directly or via a switch, to the input of DC/SFQ converter 22. The DC/SFQ converter 22 produces a stream of SFQ pulses whose frequency corresponds to that of the sinusoidal reference clock 20. The output of converter 22 is then coupled directly, or via a switch 24, to an input of two-input confluence buffer 30. The output of confluence buffer 30 is then coupled via signal enable switch 50 to the "IN" input of digital counter 52. Concurrently, the output of TDC events sensor 410 is coupled via TDC front-end 421 to the input of a switch 422, which is enabled by a signal from mode select 200. The output of switch 422 is then coupled via OR gate 40 to the input of a DC/SFQ converter 42 whose output is applied to the "READ" input of digital counter 52. As noted above, converter 42 may not be needed when two separate DC/SFQ converters are placed either before or after the Hit Enable Switch 422 and either before or after the Read Enable Switch 414. Concurrently, the mode select circuit 200 prevents any output from the ADC front end 12 and the low pass filter 14 to be propagated to confluence buffer 30 by causing switch 16 to be turned off. Also, concurrently, a signal from mode select 200 disables switch 414 to prevent any signal from the ADC clock path to be propagated to OR gate 40. Note that TDC events sensor 410 (which may be detector sensor 210) provides the Hit pulses to the TDC input 41.

For the embodiment shown in the figures the TDC operation may be as follows.

1. The TDC operation may be started by enabling the Signal Enable switch 50. This allows clock pulses from converter 22 passing through switch 24 and buffer 30 to pass through switch 50 and to be applied to the "IN" terminal of counter 52.

2. The first Hit pulse (Hit 1) produced by sensor 410 and front-end 421 passing through switch 422, gate 40 and converter 42 is applied to the "READ" input of counter 52 causing the count accumulated in binary counter 60 to be transferred (first time stamp) in parallel to the first row (B1) of memory buffer 70. After the transfer the binary counter 60 is reset. This count ($T_1$) corresponds to the number of clock periods between the Start and the first Hit. The binary counter starts counting anew.

3. The second Hit pulse (Hit 2) produced by sensor 410 causes the contents of the first stage (B1) of memory buffer 70 to be transferred to the second stage (B2) of memory buffer 70 and, concurrently, causes the count accumulated in binary counter 60 since the first Hit (second time stamp) to be transferred to B1 and then resetting the binary counter 60. This count ($T_2$) corresponds to the number of clock periods between the first and the second Hits.

4. The third Hit pulse (Hit 3) produced by sensor 410 causes the contents of the second row (B2) of memory buffer 70 to be transferred to the third row (B3) of memory buffer 70, the contents of B1 to be transferred to B2 and the contents of binary counter 60 to be transferred to B1. The binary counter 60 is then reset. Thus, this transfers the count in counter 60 (third time stamp) to the first stage of the memory buffer 70 and resets the counter 60. This count ($T_3$) corresponds to the number of clock periods between the second and the third Hits.

5. For purpose of illustration assume that the third row (B3) of the memory buffer 70 is the last stage of the memory and that B3 is configured to form the parallel-to-serial converter stage 80 and that it now contains the first time stamp. At this point the Signal Enable switch 50 is turned off; no further clock pulses are applied to the counter 52.

6. Assuming each stage of counter 60, buffer memory 70 and p/s converter 80 to include "N" (e.g., 16) stages, a set of at least "N" (e.g., 16) serial readout clock pulses (applied on line 82 from a clock generator, not shown, in FIG. 3) is applied to the parallel-to-serial converter 80, which is the third memory buffer, producing a first serial digital output ($T_1$). This also defines the first serial readout from the counter.

7. A Word Trigger pulse generated by circuitry (not shown) shifts the contents of the first/second stages of the memory buffer to the second/third rows of the memory buffer. The third memory buffer or the parallel-to-serial converter now has the second time stamp.

8. Another set of at least N (e.g., 16) clock pulses is applied to the parallel-to-serial converter producing a second serial digital output ($T_2$) from the counter.

9. Another Word Trigger pulse shifts the contents of the second memory buffer to the third memory buffer. The third memory buffer or the parallel-to-serial converter now has the third time stamp.

10. A new set of at least N (e.g. 16) clock pulses is applied to the parallel-to-serial converter 80 producing a third serial digital output ($T_3$).

The above describes one manner (as shown in FIG. 3C) of serially entering data into an N stage counter 60, then transferring the data in parallel from the N stage counter 60 to the N stages of an M-row memory buffer 70 and then transferring the contents of the memory buffer 70 one row at a time to a parallel to serial converter for further processing via a differential amplifier whose output is also further processed. It should be evident that various modes of operating the series to parallel to series arrangement may be used.

As noted above, circuits and systems embodying the invention include a common selectable interface between the digital counter 52 and the outputs of the ADC front-ends and the TDC front-ends. The selectable interface includes coupling circuits with a select switch that allows the asynchronous SFQ pulse stream from the ADC (sensitive SQUID) front-end or the synchronous (clock) SFQ pulse stream from the TDC front-end to be coupled to the digital counter. The invention also includes improved isolation between the output of the ADC front-end and the filter to prevent unwanted SQUID resonances from reducing the digitizer signal-to-noise ratio.

As noted above, the dual-function digitizer includes:

A) ADC SQUID (12) which converts the charge (or current) of an input current pulse to a number of SFQ pulses, with fundamental accuracy;

B) TDC SQUID (421) which produces an SFQ pulse every time the input a signal exceeds a threshold detecting the input pulse arrival;

C) ADC Readout Clock generator 412, which may be on-chip or off chip produces a signal at the desired readout frequency (typically 100 kHz to 100 MHz, corresponding to an ADC integration time of 10 ms to 10 ns);

D) TDC Reference Clock generator (20, 22) normally the highest clock signal includes a DC/SFQ converter 22 which produces an SFQ pulse in each period of a sinusoidal external clock (20) at the desired reference frequency (typically 10 GHz, or higher, corresponding to a TDC time resolution of, for example, 50 ps); As shown in FIG. 7, the TDC SFQ reference clock source may, for example, be formed as shown in 20a or as shown in 20b. In 20a a TDC reference clock source drives a DC to SFQ converter 22 to produce a high frequency reference clock. In 20b a high frequency on-chip SFQ clock source is formed. The clock source circuit may be as shown and taught in co-pending application Ser. No. 09/599,734 titled ON-CHIP LONG JOSEPHSON JUNCTION CLOCK (LJJ) CLOCK TECHNOLOGY.

E) A Selectable Interface (98), to enable a user to choose between the ADC or the TDC function;

F) A Digital Counter (52), which counts the number of SFQ pulses at its input ("In") between successive "Read" pulses and produces a digital count at the end of each read interval; the counter may include an optional memory buffer to store the data allowing multi bit operation in the TDC mode;

G) Read-Out Circuitry includes an optional parallel to serial (P/S) converter to serialize the output of the binary counter and output driver(s) which convert(s) SFQ signals to binary valued voltage levels; and H) Control electronics to switch enable and mode selection in a FIFO buffer and interface with room-temperature electronics.

A multi-hit TDC, embodying the invention, has demonstrated 30 ps raw time resolution (with 33 GHz reference clock) with 6 ps fine time resolution by adding a prescaler circuit.

Figure 8:
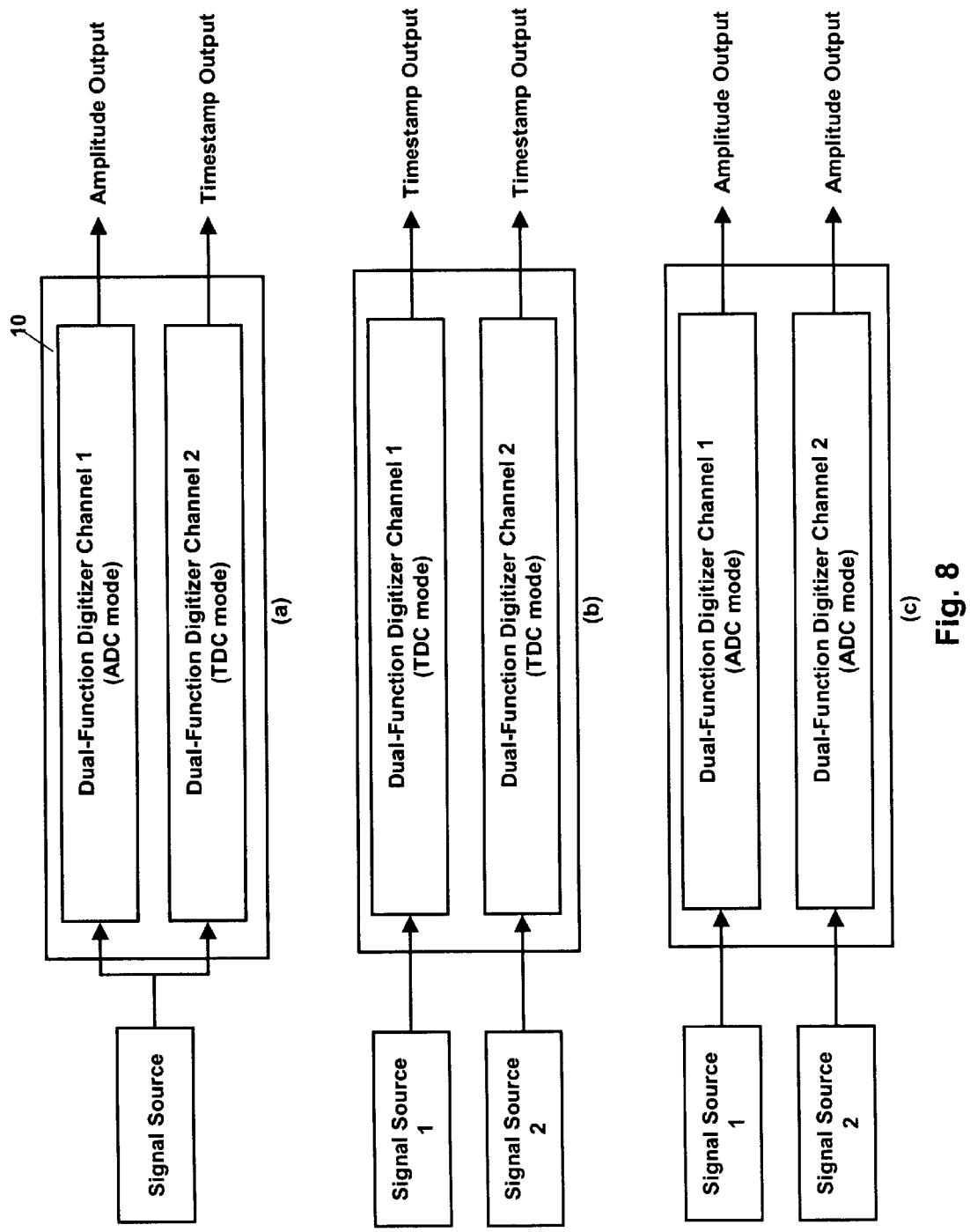
FIGS. 8($a$), 8($b$) and 8($c$) illustrate in block form multi-digitizer channels formed on an integrated circuit (IC) chip.

It should be appreciated that, as shown in FIG. 8, a chip 10 may be formed with two, or more, digitizer channels, where each channel can be operated either in the ADC mode or in the TDC mode. In 8(*a*) the same signal source can be used to drive two different channels at the same time with one channel set to the ADC mode and the other channel set to the TDC mode. This enables the amplitude output and the time stamp output of a signal to be obtained at the same time from the same chip, sharing the same clock sources. FIGS. 8(*a*) and 8(*b*) show that different signal sources may be applied to the different channels.

The strategic advantages in using a superconductive IC technology include superior speed, extreme radiation hardness, response linearity, and the simplicity of the devices, such as the time-to-digital converter disclosed herein. These intrinsic properties of superconducting electronics enable meeting demands for reduced power consumption, better radiation hardness, higher speed of operation, and better accuracy. In accordance with one embodiment of the invention, the proposed system may have a time resolution down to 2 ps and a sensitivity of 250 electrons, while dissipating only 0.25 mW per chip. The power dissipation of a superconductive digitizer embodying the invention, even including a cryogenic refrigerator, is still far less than that of the best semiconductor device. Cost savings are also enabled, because of radiation hardness, a fundamental feature of superconducting electronics, which dramatically increases the lifetime of electronics based on this technology.

This new digitizer technology may aid in the development of other high-speed electronics, fiber optics, and high data rate communications. The proposed superconductive ADC/TDC technology may benefit Department of Energy research programs by increasing the physics potential of experiments while reducing the overall cost of the systems.

The proposed dual-function digitizer has direct application in both high-energy and nuclear physics research. With the advent of faster detectors, the need for high-resolution ADC/TDC electronics is projected to rise dramatically. TDC technology embodying the invention is extendable to many channel systems and has multi-hit capability. In addition, it may turn out to be a powerful technique in particle ID determination for both fixed-target and colliding beam experiments.

High-sensitivity ADC and high-resolution TDC embodying the invention may be used to measure a Visible Light Photon Counters (VLPCs) output signal of 30,000–100,000 electrons while providing accurate timing information. Readout electronics for other cryogenic detectors include Ge detectors, liquid-Argon calorimeters, superconducting tunnel junction (STJ) X-ray detectors, transition edge sensors (TES) and other infrared (IR) detectors.

Future RHIC and LHC heavy-ion experiments envision mid-rapidity time of flight (TOF) measurements with detector areas up to 150 square meters. Because conventional TOF systems are exceedingly costly, the use of parallel-plate spark counters (Pestov counters) has been considered to reduce cost. However, the excellent time resolution (25 ps) of these counters is limited by the binning of conventional semiconductor time digitizers. The TDC embodying the invention circumvents this limitation.

The proposed digitizer system is an excellent match for precise monitoring of accelerator beam characteristics, because it performs functions that are currently unattainable on a single IC. Current approaches with less performance require many semiconductor devices and carry the penalty of their associated power consumption and heat dissipation. A detailed understanding of bunch dynamics is required to achieve the best performance in any possible collider. Therefore, the ability to digitize bunch signals at frequencies higher than previously achievable may directly impact collider performance.

What is claimed is:

1. A dual function digitizer comprising:
   an analog signal input terminal for the application thereto of analog signals of varying amplitude;
   a superconducting analog to digital converter (ADC) front end circuit having an input coupled to said analog signal input and having an output for producing thereat a single flux quantum (SFQ) pulse train whose frequency is a function of the amplitude of the analog input signal;
   a reference clock generator having an output for producing thereat a single flux quantum (SFQ) pulse train whose frequency corresponds to that of said reference clock generator;
   means for selectively coupling either the output of said ADC front end circuit or the output of said reference clock generator to a counting input of a digital counter; and
   means for selectively applying either a sampling clock signal or start/stop signals to a control/read input of said digital counter.

2. The dual function digitizer as claimed in claim 1, wherein said means for applying start/stop signals to a control/read input of said digital counter includes a superconducting time-to-digital (TDC) front-end circuit having an input responsive to an input signal and having an output at which is produced an SFQ pulse whenever the input signal exceeds a threshold value.

3. The dual function digitizer as claimed in claim 2, wherein said means for selectively applying a sampling clock to a control/read input of said digital counter includes an ADC readout clock source.

4. The dual function digitizer as claimed in claim 3, wherein said means for selectively coupling either the output of said ADC front end circuit or the output of said reference clock generator to a counting input of a digital counter and said means for selectively applying either a sampling clock signal or start/stop signals to a control/read input of said digital counter includes a mode selector for setting the digitizer to an ADC mode or a TDC mode.

5. The dual function digitizer as claimed in claim 4, wherein the output of the ADC front end circuit is coupled via a first switch to one input of a first OR gate; wherein the output of the reference clock generator is coupled via a second switch to another input of the first OR gate; wherein the output of the TDC front end circuit is coupled via third switch to an input of a second OR gate; wherein the ADC readout clock source is coupled via a fourth switch to another input of the second OR gate; wherein the output of the first OR gate is coupled to the counter input of the digital counter and wherein the output of the second OR gate is coupled to the control/read input of the digital counter.

6. The dual function digitizer as claimed in claim 5, wherein the output of the first OR gate is coupled via a fifth switch to the counter input of the digital counter.

7. The dual function digitizer as claimed in claim 3, wherein said TDC and said ADC are coupled, and responsive, to the output of a common signal source.

8. The dual function digitizer as claimed in claim 2, wherein said means for selectively coupling either the output of said ADC front end circuit or the output of said reference clock generator to a counting input of a digital counter and said means for selectively applying either a sampling clock or start/stop signals to a control/read input of said digital counter includes a mode select circuit for in one mode coupling the output of said ADC front end to the counter input and the sampling clock to the control/read input of the counter and in the other mode coupling the output of the TDC front end to the control/read input of the counter and the output of the reference clock generator to the count input of the counter.

9. The dual function digitizer as claimed in claim 8, wherein said TDC is a superconducting circuit having an input coupled to said signal input terminal.

10. The dual function digitizer as claimed in claim 1, wherein said ADC front end circuit includes an input coil to which said analog input signal is coupled; and wherein said input coil is coupled to a superconducting quantum interference device (SQUID) having an output at which is produced said SFQ pulses whose instantaneous frequency is a function of the amplitude of the analog input signal and wherein said SQUID output is coupled via a Josephson transmission line (JTL) to said output of said ADC front end circuit.

11. The dual function digitizer as claimed in claim 1, wherein said ADC front end circuit includes a feedback circuit, comprising a resistor and an inductor in series, which couples a feedback signal to the said superconducting quantum interference device (SQUID) to extend the linear operating region of the ADC.

12. The dual function digitizer as claimed in claim 2 wherein said TDC front end circuit includes a DC/SFQ converter for producing a single flux quantum (SFQ) pulse.

13. The dual function digitizer as claimed in claim 2 wherein said TDC front end circuit includes a dual-output DC/SFQ converter followed by an RS flip-flop, for producing a single flux quantum (SFQ) pulse corresponding to each event that exceeds a threshold level.

14. The dual function digitizer as claimed in claim 1 wherein said digital counter includes: (a) an N-stage ripple binary counter; (b) a memory buffer having M rows with each row having N stages; and wherein each one of the N stages of the ripple counter is connected in parallel to a corresponding stage of the first row of the memory buffer, with the contents of each row of the buffer being propagated along the rows of the memory buffer for storing the outputs of the binary counter in parallel.

15. The dual function digitizer as claimed in claim 1 wherein said digital counter includes an N-stage ripple binary counter and means for coupling the outputs of each one of said N stages to output drivers.

16. The dual function digitizer as claimed in claim 1 wherein said digital counter includes an N-stage ripple binary counter and means for coupling the outputs of each one of said N stages so they are serially applied to the input of an output driver.

17. The dual function digitizer as claimed in claim 1 wherein said digital counter includes an N-stage serial binary counter, with each stage being connected in parallel to the input of a memory buffer having M rows, each row having N stages, for storing the outputs of the binary counter in parallel; and a parallel to serial converter for converting the output of the memory buffer to a serial output.

18. The dual function digitizer as claimed in claim 1 wherein the output of a detector is coupled to said analog input terminal.

19. The dual function digitizer as claimed in claim 1 wherein the output of a detector is selectively coupled to said analog input terminal for sensing the amplitude of the signals produced at the output of the detector; and wherein the output of the detector is selectively coupled to said control input of said digital counter for measuring the time elapsed between output signals produced by the detector.

20. The dual function digitizer as claimed in claim 2, wherein said ADC front end circuit includes an input coil to which said analog input signal is coupled; and wherein said input coil is coupled to a superconducting quantum interference device (SQUID) having an output at which is produced said SFQ pulses; wherein said TDC front end circuit includes a DC/SFQ converter for producing said single flux quantum (SFQ) pulse; wherein the output of said ADC front end circuit is coupled via a first switch to an input of a first OR gate; wherein the output of the DC/SFQ converter of the TDC is coupled to an input of a second OR gate; wherein each OR gate has an output; and means for coupling the output of the first OR gate to the counting input of the digital counter and the output of the second OR gate to the control/read input of the digital counter.

21. The dual function digitizer as claimed in claim 20 wherein said means coupling the output of the first OR gate to the counting input of the digital counter includes a second switch.

22. The dual function digitizer as claimed in claim 2 wherein said means for selectively coupling either the output of said ADC front end circuit or the output of said TDC front end circuit includes a mode selector responsive to the application of a control current.

23. The dual function digitizer as claimed in claim 1 wherein said reference clock generator includes a reference clock source coupled to a DC/SFQ converter for producing said SFQ pulse train whose frequency is a function of the frequency of the clock source.

24. The dual function digitizer as claimed in claim 1, wherein said reference clock generator is an SFQ clock source.

25. The dual function digitizer as claimed in claim 2 wherein the ADC circuit, the TDC circuit the digital counter, the coupling means and the means for applying are all formed on the same integrated circuit (IC).

26. A dual function digitizer comprising:
a signal input terminal for the application thereto of input signals of varying amplitude;
a superconducting analog to digital converter (ADC) front end circuit having an input coupled to said signal input terminal and having an output for producing thereat a single flux quantum (SFQ) pulse train whose instantaneous frequency is a function of the amplitude of the analog input signal;
a reference clock generator having an output for producing thereat a single flux quantum (SFQ) pulse train of predetermined frequency;
a superconducting time-to-digital converter (TDC) front-end circuit responsive to an input signal having an output for producing thereat a single flux quantum (SFQ) pulse whenever the input signal exceeds a predetermined threshold value; and
mode select means for: (a) in one mode coupling the output of said ADC front end circuit to a counting input of a digital counter and a sampling clock to a control/read input of said digital counter; and (b) in another mode coupling the output of said reference clock generator to the counting input of the digital counter and the output of the TDC front end circuit to the control/read input of said digital counter.

27. The dual function digitizer as claimed in claim 26 wherein the same signal source is coupled to the input of the ADC and to the input of the TDC.

28. A dual function digitizer comprising:
a signal input terminal for the application thereto of input signals of varying amplitude;
a superconducting analog to digital converter (ADC) front end circuit having an input connected to said signal input terminal and having an output for producing thereat a single flux quantum (SFQ) pulse train whose frequency is a function of the amplitude of the input signal;
a reference clock having an output for producing thereat a reference signal of given frequency;
a superconducting time to digital converter (TDC) front end circuit having an input responsive to an input signal and having an output for producing thereat a single flux quantum (SFQ) pulse in response to an input signal exceeding a predetermined value;
a digital counter having a counting input terminal for receiving input signals to be counted and a control terminal for selectively reading out the contents of the digital counter;

first means for selectively coupling either the output of said ADC front end circuit or the output of said reference clock to the counting input of said digital counter;

a sampling clock signal source; and second means for selectively coupling either the output of the TDC front end circuit or the sampling clock signal source to the control terminal of the digital counter.

29. The dual function digitizer as claimed in claim 28 wherein said first and second means includes a mode selector for, in one mode, selectively coupling said output of said ADC front end to said counting input terminal and said sampling clock source to said control terminal of said digital counter in one mode and for, in another mode, selectively coupling the output of said reference clock to said counter input and for coupling the output of the TDC front end to the control terminal of the digital counter.

30. The dual function digitizer as claimed in claim 28 wherein a first signal source is coupled to the ADC front end circuit and a second signal source is coupled to the input of the TDC front end circuit.

31. The dual function digitizer as claimed in claim 28 wherein a common signal source is coupled to the ADC front end circuit and to the input of the TDC front end circuit.

32. A combination comprising:

a superconducting analog to digital converter (ADC) circuit having an input and an output;

a superconducting time to digital converter (TDC) circuit having an input and an output;

means for coupling signal sources to the inputs of said ADC and said TDC;

a reference clock generator having an output for producing thereat a single flux quantum (SFQ) pulse train having a given frequency;

a digital counter having a counting input terminal for receiving input signals to be counted and a control terminal for selectively reading out the contents of the digital counter;

a sampling clock signal having a given frequency for sampling data accumulated in the counter;

means for selectively coupling one of the outputs of said ADC circuit and the reference clock to the input of said digital counter; and means for selectively coupling one of the Output of said TDC circuit and said sampling clock signal to the control terminal of said digital counter.

33. The combination as claimed in claim 32 wherein the TDC circuit functions as an events detector in response to the application of signals to its inputs.

34. The combination as claimed in claim 33 wherein the same signal source is applied to the input of the ADC and TDC circuits.

35. The combination as claimed in claim 32 wherein said means for selectively coupling one of the outputs of said ADC circuit and the reference clock to the input of said digital counter and said means for selectively coupling one of the output of said TDC circuit and said sampling clock signal to the control terminal of said digital counter includes a mode selector circuit.

36. An integrated circuit (IC) comprising:

N digitizer channels formed on said IC, where N is an integer greater than one (1); each one of said N digitizer channels including a superconducting analog to digital converter (ADC) circuit having an input and an output and a superconducting time to digital converter (TDC) circuit having an input and an output; and the outputs of the ADC and TDC circuits being selectively coupled to a digital counter having a counting input terminal for receiving input signals to be counted and a control terminal for selectively reading out the contents of the digital counter for enabling each digitizer channel to be operated as an ADC or a TDC;

means for coupling signal sources to the inputs of said ADC and said TDC circuits of each channel; and means coupled to each one of said N digitizer channels for selectively operating a selected channel as an ADC or as a TDC.

37. The IC as claimed in claim 36 wherein the same signal source is coupled to the inputs of two of said N digitizer channels.

* * * * *